United States Patent
Endo et al.

(10) Patent No.: US 6,197,704 B1
(45) Date of Patent: Mar. 6, 2001

(54) METHOD OF FABRICATING SEMICONDUCTOR DEVICE

(75) Inventors: Kazuhiko Endo; Keisuke Shinoda, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/286,986

(22) Filed: Apr. 7, 1999

(30) Foreign Application Priority Data

Apr. 8, 1998 (JP) .................................. 10-095801

(51) Int. Cl.[7] .................. H01L 21/31; H01L 21/469
(52) U.S. Cl. .................. 438/781; 438/780; 438/789; 438/788
(58) Field of Search .................. 438/781, 783, 438/784, 789, 788, 763, 780

(56) References Cited

U.S. PATENT DOCUMENTS

| | | | |
|---|---|---|---|
| 5,376,586 | * 12/1994 | Beilin et al. | 438/781 |
| 5,804,259 | * 9/1998 | Robles | 438/763 |
| 5,930,655 | * 7/1999 | Cooney et al. | 438/781 |
| 6,030,904 | * 2/2000 | Grill et al. | 438/781 |

FOREIGN PATENT DOCUMENTS

| | | |
|---|---|---|
| 8-195565 | 7/1996 | (JP) . |
| 8-264648 | 10/1996 | (JP) . |
| 9-115898 | 5/1997 | (JP) . |
| 9-237837 | 9/1997 | (JP) . |
| 11-87342 | 3/1999 | (JP) . |
| 11-150357 | 6/1999 | (JP) . |
| 11-154672 | 6/1999 | (JP) . |
| 11-265885 | 9/1999 | (JP) . |

OTHER PUBLICATIONS

Y. Matsubara et al., "Low–k Fluorinated Amorphous Carbon Interlayer Technology for Quarter Micron Devices", *IEDM 96*, 1996, pp. 369–372.

* cited by examiner

Primary Examiner—Charles Bowers
Assistant Examiner—Hsien-Ming Lee
(74) Attorney, Agent, or Firm—Sughrue, Mion, Zinn Macpeak & Seas, PLLC

(57) ABSTRACT

There is provided a method of fabricating a semiconductor device having a multi-layered structure and including an interlayer insulating film composed of carbon family material, the method including the steps of (a) depositing an insulating film on a lower wiring layer, the insulating film being composed of carbon family material, (b) annealing the insulating film in hydrogen atmosphere at a first temperature equal to or greater than a temperature at which the insulating film has been deposited, and (c) forming an upper wiring layer on the insulating film. The method suppresses gas from being discharged out of an insulating film without an increase in dielectric constant, and prevents deposited films on the insulating film from being peeled off.

24 Claims, 11 Drawing Sheets

METHOD OF FABRICATING SEMICONDUCTOR DEVICE

BACKGROUND OF THE INVENTION

1. Field of the Invention

The invention relates to a method of fabricating a semiconductor device including an insulating film composed of carbon family material, and more particularly to a method of fabricating a semiconductor device having a multi-layered wiring structure including an interlayer insulating film composed of carbon family material.

2. Description of the Related Art

With an increase in integration of a semiconductor integrated circuit such as LSI, it becomes more and more important to fabricate a multi-layered wiring structure with high reliability in fabrication of a semiconductor integrated circuit.

Reliability of a multi-layered wiring structure is dependent in particular on a characteristic of an interlayer insulating film. A material of which an interlayer insulating film is composed and a method by which an interlayer insulating film is formed have been determined from the standpoint of heat-resistance, electrical insulation, and coverage ability. For instance, an interlayer insulating film has been usually composed of silicon dioxide ($SiO_2$), silicon nitride (SiN) or phospho silicate glass (PSG), and has been usually formed by chemical vapor deposition (CVD).

However, with a design rule for LSI getting smaller, wiring delay caused by parasitic capacity between wirings has recently become more serious than signal delay caused by individual elements such as a transistor constituting LSI. As a result, due to writing delay, LSI could not be improved, even if individual elements were fabricated in a size as small as possible.

Under such circumstance, there is presently developed an interlayer insulating film having a smaller dielectric constant ∈r than a dielectric constant of a silicon nitride film and a dielectric constant of a silicon dioxide film both of which have been widely used as an interlayer insulating film in fabrication of a semiconductor integrated circuit. Herein, both a silicon nitride film and a silicon dioxide film have a dielectric constant ∈ r smaller than seven (7).

An insulating film composed of carbon family material attracts attention as a material having a small dielectric constant to be used in place of an insulating film composed of silicon family material, because an insulating film composed of carbon family material is expected to have a smaller dielectric constant. Herein, carbon family material of which an insulating film is composed includes organic polymer family material such as polyimide, poly-p-xylylene, and benzocyclobuten, and inorganic carbon family material such as amorphous carbon.

An insulating film composed of such carbon family material has a smaller dielectric constant than that of a conventional insulating film composed of silicon family material, and could have a further smaller dielectric constant by additionally containing fluorine thereinto. For instance, if an amorphous carbon film contains fluorine therein, it would be possible to decrease a dielectric constant of the amorphous carbon down to approximately 2. Composing a semiconductor device of such an amorphous carbon film has recently been reported.

The inventors had reported a method of fabricating a multi-layered wiring structure including an interlayer insulating film composed of fluorinated amorphous carbon in IEDM Technical Digest, 1996, pp. 369–372. In this report, combination of a film composed of carbon family material and a silicon dioxide film was suggested in order to make it possible to employ conventional interlayer technology.

The suggested method has the following steps.

First, a lower wiring layer composed of aluminum is covered with an amorphous carbon film containing fluorine therein and having a dielectric constant of 2.3. Then, a silicon dioxide ($SiO_2$) film is deposited on the amorphous carbon film by a thickness of about 2 microns by plasma-enhanced chemical vapor deposition. The silicon dioxide film is deposited for the purpose of ensuring processability in planarization to be carried out later by chemical mechanical polishing (CMP), and enhancing accuracy in planarization.

When the silicon dioxide film is deposited on the amorphous carbon film, the silicon film is made silicon-richer at least at an interface between the silicon dioxide film and the amorphous carbon film in order to enhance adhesion between the films.

After the deposition of the silicon dioxide film, the silicon dioxide film is planarized by CMP. Then, the amorphous carbon film is formed with via-holes with the silicon dioxide film being used as a hard mask. Then, the thus formed via-holes are filled with aluminum plug. Thus, there is completed a multi-layered wiring structure.

The multi-layered wiring structure formed in the above-mentioned manner can have a parasitic capacity which is reduced by about 50% relative to that of a conventional multi-layered wiring structure including an interlayer insulating film composed of silicon dioxide.

As having been explained so far, in order to form a multi-layered wiring structure including an insulating film composed of carbon family material, with high processability being maintained, it is necessary to deposit an insulating film which is to be planarized later and which is composed of a conventional material such as silicon dioxide, on an interlayer insulating film composed of carbon family material with high adhesion being maintained therebetween.

In addition, a thin film composed of refractory metal such as titanium nitride, titanium, tantalum nitride, and tantalum may be sandwiched between the interlayer insulating film and the silicon dioxide film in order to prevent mutual diffusion between the interlayer insulating film and metal of which a wiring layer is composed, such as aluminum and copper.

As explained above, it is necessary to carry out various steps including steps of depositing films after deposition of an interlayer insulating film composed of carbon family material, in order to fabricate a multi-layered wiring structure. These steps are inevitably accompanied with an annealing step. Hence, it is necessary to prevent various defects such as peeling-off and mutual diffusion from being caused by an annealing step to be carried out after formation of an insulating film composed of carbon family material, between the insulating film and other films to be deposited on the insulating film such as the above-mentioned film to be planarized and refractory metal film. If defects such as peeling-off and mutual diffusion are caused, a semiconductor device could not work properly, resulting in reduction in reliability and fabrication yield.

However, if an insulating film composed of carbon family material is heated up to about 400 degrees centigrade, gas is discharged out of the insulating film. The gas breaks adhesion between the insulating film and a silicon dioxide film or other films deposited on the insulating film, resulting in film peeling-off in a multi-layered wiring structure. Hence, it is necessary to reduce an amount of gas discharged out of the insulating film to thereby prevent peeling-off of films caused in an annealing step to be carried out after formation of the insulating film.

In order to prevent films from peeling off in an annealing step, it is necessary to reduce an amount of gas desorped out of an insulating film by annealing. If an insulating film composed of carbon family material is annealed after deposition of the insulating film, but prior to deposition of films on the insulating film, gas desorped out of the insulating film is discharged out of a multi-layered wiring structure. Accordingly, it would be possible to prevent films deposited on the insulating film from being peeled off, even if those films are subject to annealing.

In a conventional method, an insulating film composed of carbon family material are subject to an annealing step in a vacuum atmosphere or in an inert gas atmosphere such as nitrogen and argon. The conventional method makes it possible to reduce an amount of gas to be discharged in later steps, but is accompanied with a problem that a dielectric constant of the insulating film is increased in comparison with the dielectric constant before carrying out an annealing step. In other words, a small dielectric constant by which an insulating film composed of carbon family material is characterized is incompatible with processability.

For instance, Japanese Unexamined Patent Publication No. 8-195565has suggested a method of fabricating a multi-layered wiring structure, comprising the steps of forming a wiring layer on a substrate, applying photosensitive polymer on the wiring layer, drying the photosensitive polymer, exposing the photosensitive polymer to a light in a pattern, developing the photosensitive polymer to thereby form via-holes in the photosensitive polymer, curing the photosensitive polymer to thereby form an interlayer insulating film, and forming an upper wiring layer on the insulating film.

Japanese Unexamined Patent Publication No. 8-264648 has suggested a semiconductor device including an interlayer insulating film composed of fluorine-containing amorphous carbon, an electrode, a wiring layer, and a buffer layer sandwiched between the interlayer insulating film and the wiring layer. The buffer layer prevents gas from being discharged out of the interlayer insulating film in an annealing step.

Japanese Unexamined Patent Publication No. 9-237837 has suggested a method of fabricating a multi-layered wiring structure, comprising the steps of forming a first wiring layer on a substrate, patterning the first wiring layer, forming a photosensitive polymer layer on the thus patterned first wiring layer, exposing the photosensitive polymer layer to a light, developing the photosensitive polymer layer to thereby form an interlayer insulating film, and forming a second wiring layer on the insulating film.

However, none of the above-mentioned Publications can overcome the problem mentioned earlier that a dielectric constant of the insulating film becomes greater than before carrying out an annealing step.

SUMMARY OF THE INVENTION

In view of the above-mentioned problem, it is an object of the present invention to provide a of fabricating a semiconductor device which method is capable of reducing an amount of gas to be discharged out of an insulating film composed of carbon family material and of preventing films deposited on the insulating film from being peeled off without an increase in a dielectric constant.

There is provided a method of fabricating a semiconductor device including an insulating film composed of carbon family material, the method includes the steps of (a) depositing an insulating film composed of carbon family material, (b) desorbing volatile components out of the insulating film, and (c) depositing a film on the insulating film.

There is further provided a method of fabricating a semiconductor device including an insulating film composed of carbon family material, the method includes the steps of (a) depositing an insulating film composed of carbon family material, and (b) annealing the insulating film in hydrogen atmosphere at a first temperature equal to or greater than a temperature at which the insulating film has been deposited.

There is still further provided a method of fabricating a semiconductor device having a multi-layered structure and including an interlayer insulating film composed of carbon family material, the method includes the steps of (a) depositing an insulating film on a lower wiring layer, the insulating film being composed of carbon family material, (b) annealing the insulating film in hydrogen atmosphere at a first temperature equal to or greater than a temperature at which the insulating film has been deposited, and (c) forming an upper wiring layer on the insulating film.

The insulating film may be deposited by any one of plasma-enhanced chemical vapor deposition, thermal chemical vapor deposition, and spin coating.

It is preferable that the insulating film is composed of hydrogen-containing amorphous carbon, in which case, it is preferable that the method further includes the step of locally reducing a hydrogen concentration in the vicinity of interfaces between the hydrogen-containing insulating film and other films.

It is preferable that the insulating film is composed of fluorine-containing amorphous carbon, in which case, it is preferable that the method further includes the step of locally reducing a fluorine concentration in the vicinity of interfaces between the fluorine-containing insulating film and other films.

As an alternative, the insulating film may be composed of poly-p-xylylene or polyimide.

It is preferable that a pressure of the hydrogen atmosphere is equal to or greater than $1 \times 10^{-3}$ Torr.

The hydrogen atmosphere may contain inert gas.

It is preferable that the first temperature is equal to or greater than 200 degrees centigrade, and equal to or lower than a second temperature at which the insulating film is decomposed. For instance, the second temperature may be set equal to 450 degrees centigrade.

In the method in accordance with the present invention, volatile components contained in an insulating film composed of carbon family material are desorbed out of the insulating film before deposition of films on the insulating film. Then, other films such as a silicon dioxide film and so on are deposited on the insulating film. The desorption of volatile components is achieved, for instance, by annealing. For instance, by carrying out annealing at a temperature at which the insulating film has been deposited, volatile components having been residual in the insulating film while the insulating film was being formed are more easily desorbed.

A key in the above-mentioned annealing is that the annealing is carried out in a hydrogen atmosphere. If annealing is carried out in an inert gas atmosphere like a conventional method, a portion of radicals to be discharged out of an insulating film is trapped in the insulating film. This results in a dielectric constant of the insulating film increase due to the orientation of the trapped radicals after carrying out annealing.

On the other hand, in accordance with the present invention, an insulating film composed of carbon family material is annealed in a hydrogen atmosphere. This facilitates free radicals generated in annealing to react with hydrogen, and to be discharged out of the insulating film. Thus, the present invention makes it possible to reduce an amount of gas discharged in annealing and remove residual radicals in the insulating film, resulting in the prevention a dielectric constant of the insulating film is prevented from increasing.

The above-mentioned advantage obtained by the present invention is explained in detail hereinbelow.

While an insulating film composed of carbon family material is being heated, components contained in the insulating film are gradually desorped as a temperature of the insulating film is raised. In an insulating film composed of carbon family material, carbon atoms generally form sp2 or sp3 hybridized orbital to thereby bond with other carbon atoms. In the insulating film, there is formed a network of carbon-carbon bonds. This network is called cross-link, and enhances heat-resistance of the insulating film.

Hydrogen and fluorine atoms contained in the insulating film break cross-link of carbon atoms by forming C—H bondings and C—F bonds, respectively. Hence, the insulating film containing hydrogen and/or fluorine at a higher concentration would have smaller heat-resistance.

Among coupling radicals present in the insulating film, coupling radicals having one carbon-carbon bonds through which the coupling radicals are coupled to the insulating film, and remaining bondings of carbon which are terminated with light elements, such as hydrogen and fluorine, are desorped at a temperature equal to or greater than about 200 degrees centigrade.

Accordingly, in order to reduce an amount of gas to be discharged out of the insulating film, it necessary to heat the above-mentioned coupling radicals making the bond with the insulating film weak, to thereby be desorped out of the insulating film. Then, other films such as a silicon dioxide film and so on may be deposited on the insulating film. Thus, it would be possible to prevent gas from being discharged out of the insulating film in an annealing step, which ensures prevention of peeling-off of films deposited on the insulating film.

However, a portion of radicals desorped out of the insulating film in an annealing step is not discharged out of the insulating film, but trapped in the insulating film. Hence, annealing is carried out in a hydrogen atmosphere in the present invention. As a result, those free radicals having been trapped in the insulating film are caused to react with hydrogen atoms to thereby make them discharge out of the insulating film. Hence, it is possible to avoid polarization caused due to the orientation of the trapped free radicals, and reduce an amount of gas to be discharged out of the insulating film without an increase of a dielectric constant of the insulating film.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

[First Embodiment]

In the first embodiment, an insulating film is composed of hydrogen containing amorphous carbon. This hydrogen-containing amorphous carbon film is deposited by plasma-enhanced chemical vapor deposition (PCVD).

Figure 1:
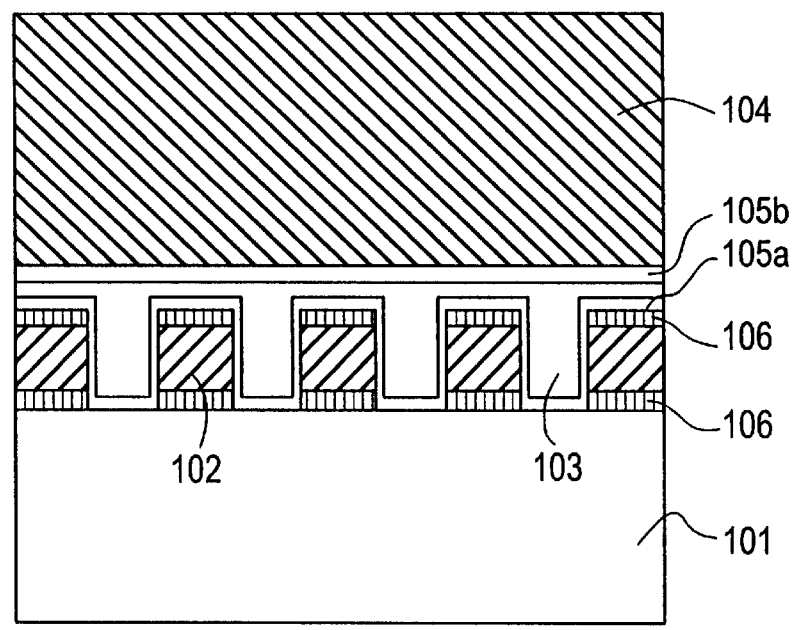
FIG. 1 is a cross-sectional view of a multi-layered wiring structure fabricated in accordance with the present invention.

FIG. 1 is a cross-sectional view of a semiconductor device to which the first embodiment is applied.

The illustrated semiconductor device is comprised of a substrate 101, aluminum wiring layers 102 formed on the substrate 101 in accordance with a conventional method, titanium nitride films 106 sandwiching the aluminum wiring layers 102 therebetween, a first cover film 105a covering the aluminum wiring layers 102 therewith for enhancing adhesion with a later mentioned hydrogen-containing amorphous carbon film 103, a hydrogen-containing amorphous carbon film 103 formed on the first cover film 105a for filling spaces formed in the aluminum wiring layers 102 therewith, a second cover film 105b formed entirely on the hydrogen-containing amorphous carbon film 103, and an upper film 104 formed on the second cover film 105b.

In a process of fabricating the above-mentioned semiconductor device illustrated in FIG. 1, the semiconductor device is subject to annealing in hydrogen atmosphere after the hydrogen-containing amorphous carbon film 103 has been formed, but before the second cover film 105b is formed on the hydrogen-containing amorphous carbon film 103.

A temperature at which the annealing is carried out is set in the range of about 250 to about 450 degrees centigrade, and preferably at 400 degrees centigrade.

The annealing in hydrogen atmosphere prevents the upper film 104 from being peeled off after deposition of the upper film 104, and further prevents a dielectric constant of the hydrogen-containing amorphous carbon film 103 from increasing.

Hereinbelow are explained detailed examples of the first embodiment.

[First Example]

In the first example, a silicon dioxide ($SiO_2$) film as the upper film 104 was deposited on the hydrogen-containing amorphous carbon film 103 having been formed by PCVD.

A silicon substrate on which devices such as transistors have been already fabricated was used as the substrate 101. On the silicon substrate 101 the aluminum wiring layers 102 were formed sandwiched between the titanium nitride films 106. The aluminum wiring layers 102 had a height of 0.6 micron, and a width of 0.5 micron. The aluminum wiring layers 102 were spaced away from each other by 0.3 micron to 1 micron. The titanium nitride films 106 sandwiching the aluminum wiring layers 102 therebetween had a thickness of 50 nm.

First, a first silicon dioxide film was deposited by a thickness of about 50 nm on the silicon substrate 101 on which the aluminum wiring layers 102 had been already formed. The first silicon dioxide film was formed silicon-richer at a surface thereof The thus formed first silicon dioxide film corresponds to the first cover film 105a.

Figure 2:
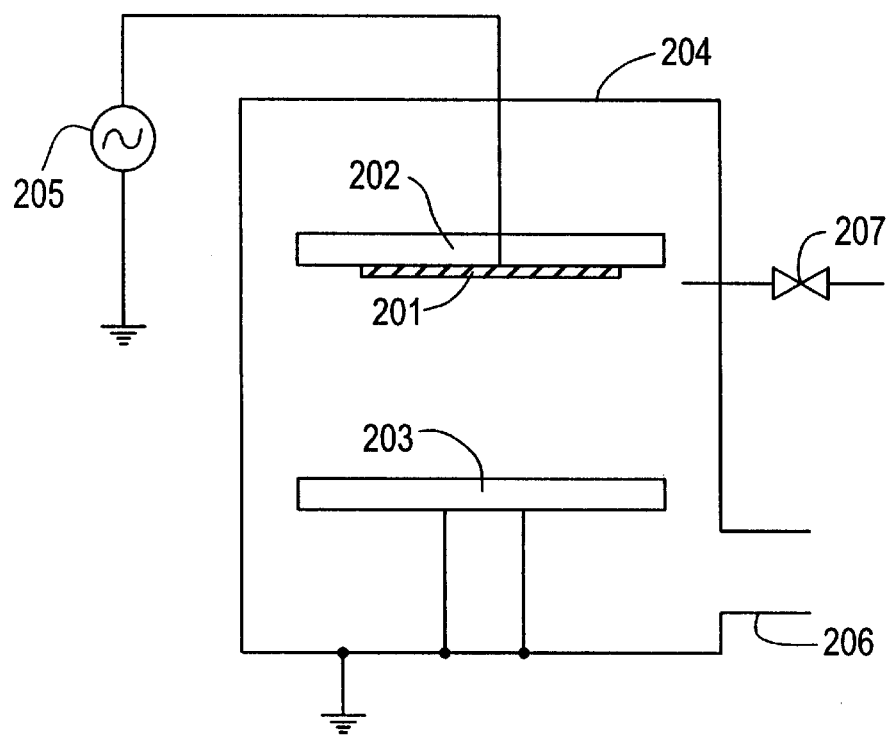
FIG. 2 is a schematic view illustrating a parallel plate type plasma-enhanced chemical vapor deposition apparatus.

The deposition of the first silicon dioxide film was carried out by means of a parallel plate type PCVD apparatus as illustrated in FIG. 2.

The PCVD apparatus illustrated in FIG. 2 is comprised of a vacuum chamber 204 having a gas outlet 206, upper and lower electrodes 202 and 203 housed in the vacuum chamber 204 in facing relation to each other, a high frequency power source electrically connected to the upper electrode 202 for supplying high frequency power to the upper electrode 202, and a gas inlet 207 for introducing process gases into the vacuum chamber 204 therethrough. A sample wafer 201 is fixed on a lower surface of the upper electrode 202.

The deposition of the first silicon dioxide film was carried out in the following conditions.

Process gas: $SiH_4$ and $O_2$
$SiH_4$ flow rate: 10 sccm
$O_2$ flow rate: 20 sccm
Deposition pressure: 10 mTorr The first silicon dioxide film was made silicon-richer at a surface by reducing the $SiH_4$ flow rate down to 10 sccm at a final stage of the deposition. The thus made silicon-richer surface of the first silicon dioxide film enhances adhesion between the first silicon dioxide film and the hydrogen-containing amorphous carbon film 103 which is later formed.

An apparatus for depositing the first silicon dioxide film is not to be limited to the above-mentioned parallel plate type CVD. Any apparatus may be employed for depositing the first silicon dioxide film, if the apparatus can vary the composition of the first silicon dioxide film. For instance, there may be employed a high density plasma enhanced CVD apparatus such as an electron cyclotron resonant (ECR) type CVD apparatus, a helicon wave type CVD apparatus, and an inductive coupling type CVD apparatus, or a thermal CVD apparatus.

Then, the hydrogen-containing amorphous carbon film 103 was deposited over the first silicon dioxide or first cover film 105a. In the first example, the hydrogen-containing amorphous carbon film 103 was deposited using $CH_4$ gas as a process gas. The apparatus by which the hydrogen-containing amorphous carbon film 103 was made was the same as the parallel plate type PCVD apparatus having been employed for depositing the first silicon dioxide film. The hydrogen-containing amorphous carbon film 103 may be deposited by means of ECR type CVD apparatus, a helicon wave type CVD apparatus, or an inductive coupling type CVD apparatus, similarly to the deposition of the first silicon dioxide film.

In the parallel plate type PCVD apparatus illustrated in FIG. 2, the sample wafer 201 was placed on a lower surface of the upper electrodes 202 to which the high frequency power source 205 supplied high frequency. As is known to those skilled in the art, self-bias is applied to an electrode to which a high frequency is applied, and ions are accelerated by the self-bias in a film to be formed.

In the case of a hydrogen-containing amorphous carbon film, hydrogen contained in the film is decreased in an amount by ion radiation, and the number of cross-links, that is, the number of carbon-carbon couplings in the film is increased. These cross-links or carbon-carbon couplings constitute a skeleton of the film. Accordingly, an amorphous carbon film formed by means of an electrode to which a self-bias power is applied could have high heat-resistance, and hence, would be a desired interlayer insulating film.

The hydrogen-containing amorphous carbon film 103 in the first example was deposited in the following conditions.

Substrate temperature: 100 degrees centigrade
$CH_4$ flow rate: 100 sccm
Ar flow rate: 10 sccm
Deposition pressure: 10 mTorr
Self-bias: −200V The hydrogen-containing amorphous carbon film 103 made in the above-listed conditions had a dielectric constant of 3.5. The hydrogen-containing amorphous carbon film 103 could cover spaces formed between the aluminum wiring layers 102, in which the spaces were 0.3 micron, and the aluminum wiring layers 102 had a height of 0.6 micron. That is, the hydrogen-containing amorphous carbon film 103 could cover therewith the aluminum wiring layers 102 having an aspect ratio of 2.

Figure 3:
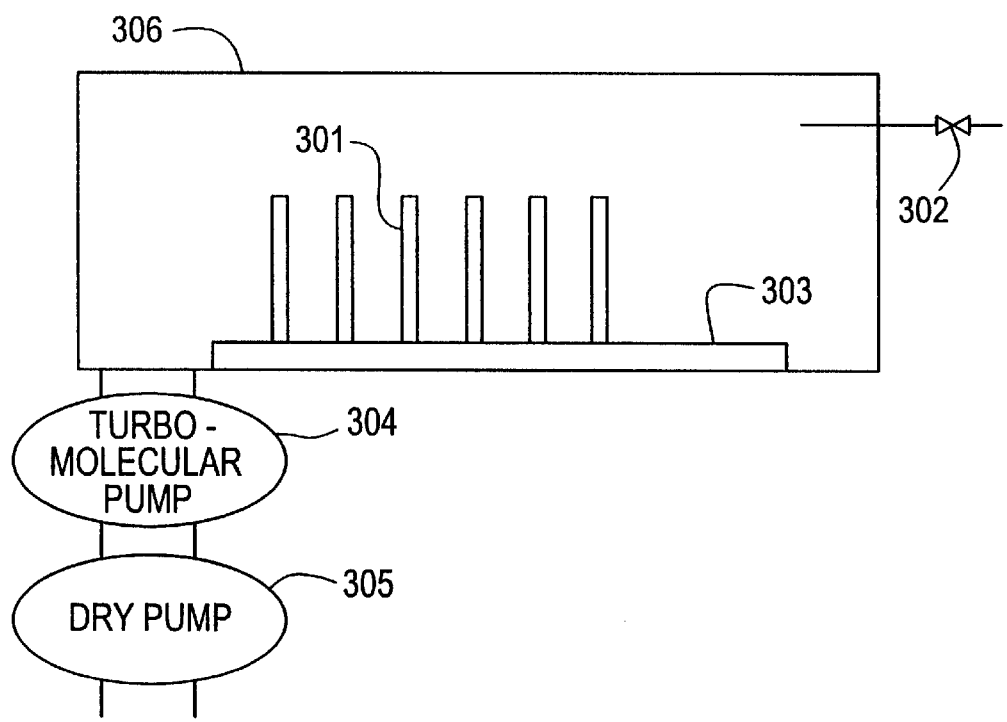
FIG. 3 is a schematic view illustrating an annealing apparatus.

Then, the semiconductor device was subject to annealing for discharging gas out of the hydrogen-containing amorphous carbon film 103. FIG. 3 illustrates an apparatus employed for annealing the semiconductor device.

The illustrated apparatus is comprised of a process chamber 306, a substrate holder 303 equipped in the process chamber 306, a turbo-molecular pump 304 connected to the process chamber 306, and a dry pump 305 connected to the process chamber 306.

The process chamber 306 is formed with a gas inlet 302 through which hydrogen gas is introduced into the process chamber 306. Annealing is carried out in a hydrogen atmosphere at an atmospheric pressure.

A plurality of substrates 301 are arranged on the substrate holder 301. By operating the turbo-molecular pump 304 and the dry pump 305, annealing can be carried out in the process chamber 306 at a degree of vacuum of $10^{-3}$ Torr or smaller.

The annealing conditions in the first example were as follows.

Pressure: Atmospheric pressure
Atmosphere: Hydrogen atmosphere
Temperature: 400 degrees centigrade
Time: 1 hour For comparison, three samples were also made. The first sample was made in nitrogen atmosphere. The second sample was made in a vacuum. The third sample was made without carrying out annealing.

After annealing, a second silicon dioxide ($SiO_2$) film was deposited on the hydrogen-containing amorphous carbon film 103 by a thickness of 2 micron. The second silicon dioxide ($SiO_2$) film was formed in the similar manner as that of the first silicon dioxide film. That is, the second silicon dioxide film was formed silicon-richer at an interface with the hydrogen-containing amorphous carbon film 103. The thus formed silicon-richer film and the second silicon dioxide film correspond to the second cover film 105b and the upper film 104 in the first embodiment illustrated in FIG. 1, respectively.

In order to check whether the above-mentioned semiconductor devices can withstand annealing to be carried out later, a test was conducted. In the test, the semiconductor devices were annealed at 400 degrees centigrade in vacuum for 1 hour, and it was checked whether films were peeled off.

In the third sample which was made without carrying out annealing, the second silicon dioxide film 104 was peeled off during the test. The second silicon dioxide film 104 was peeled off at an interface with the hydrogen-containing amorphous carbon film 103. There was observed generation of bubbles at an interface between the second silicon dioxide film 104 and the hydrogen-containing amorphous carbon film 103.

In order to inspect the reason why bubbles were generated, a spectrum of gas discharged out of the hydrogen-containing amorphous carbon film 103 was measured by temperature-up desorption process. Herein, the temperature-up desorption process is a process in which a partial pressure of gas discharged out of a specimen when the specimen is heated at a constant temperature-raising rate in vacuum is measured by means of a mass spectrometer.

Figure 4:
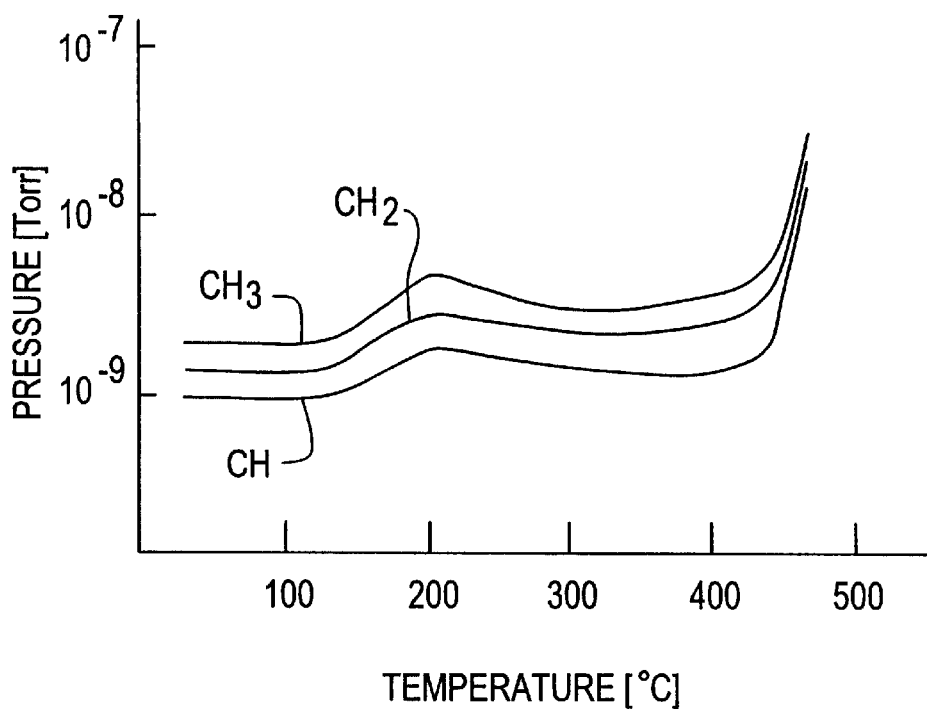
FIG. 4 is a spectrum showing how gas is desorped out of a hydrogen-containing amorphous carbon film immediately after deposition thereof.

FIG. 4 illustrates gas spectrum obtained by the above-mentioned temperature-up desorption process. In FIG. 4, an axis of ordinate indicates a partial pressure of the discharged gas, and an axis of abscissa indicates a temperature of a specimen.

It is understood in view of FIG. 4 that gases which are considered $CH_3$, $CH_2$ and CH start to be discharged at about 150 degrees centigrade, and the gas discharge reaches a peak at about 200 degrees centigrade. As the specimen temperature further increases, gases are discharged significantly again at about 450 degrees centigrade. However, this second peak indicates commencement of decomposition of the hydrogen-containing amorphous carbon film 103. Accordingly, the gas discharge which causes the second silicon dioxide film 104 to be peeled off reaches a peak at about 200 degrees centigrade.

The spectrum obtained by temperature-up desorption process reflects gases generated by dissociation in a mass spectrometer. For instance, when $CH_3$ is in desorption, $CH_3$ is dissociated into $CH_2$ and CH in an ionization chamber of a mass spectrometer, and hence, $CH_2$ and CH are also measured by the mass spectrometer. However, it is understood in view of FIG. 4 that at least one of those hydrocarbon gases is desorped out of the hydrogen-containing amorphous carbon film 103. Accordingly, the reason why the second silicon dioxide film 104 was peeled off in annealing at 400 degrees centigrade is considered that gases generated by dissociation in a mass spectrometer, such as $CH_2$ and CH in the above-mentioned example, break adhesion between the second silicon dioxide film and the hydrogen-containing amorphous carbon film 103 at the interface therebetween.

Then, the first sample in which annealing was carried out in nitrogen atmosphere was checked as to whether the second silicon dioxide film 104 was peeled off. It was not found in the first sample that the second silicon dioxide film 104 was peeled off.

Figure 5:
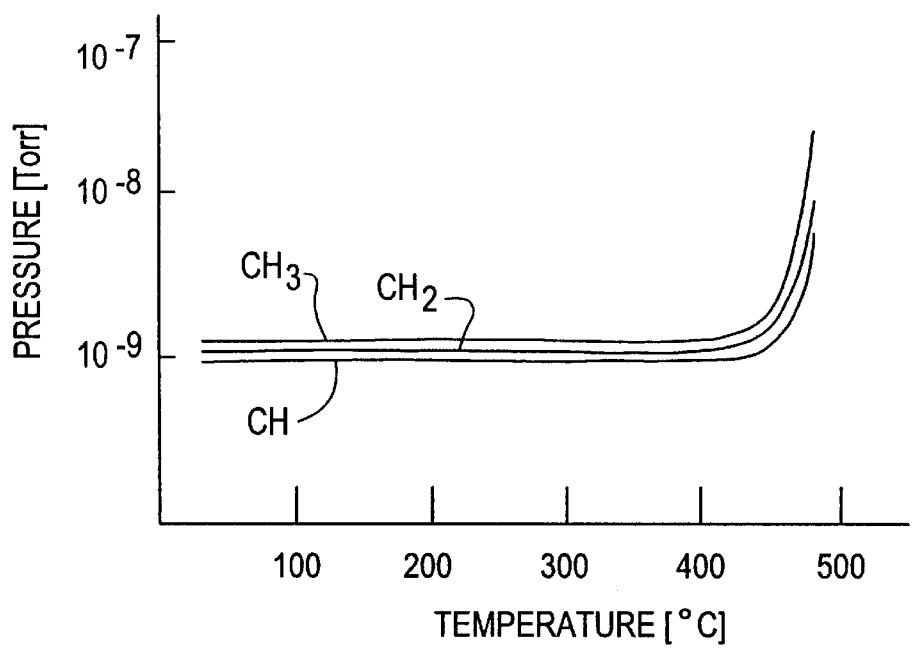
FIG. 5 is a spectrum showing how gas is desorped out of a hydrogen-containing amorphous carbon film after annealing.

FIG. 5 illustrates gas spectrum obtained by the above-mentioned temperature-up desorption process. It is understood in view of FIG. 5 that gas discharge at about 200 degrees centigrade, which was found in the third sample having been made without carrying out annealing, was not found, and was found only at 400 degrees centigrade or greater.

However, the first sample was accompanied with an increase in a dielectric constant.

Figure 6:
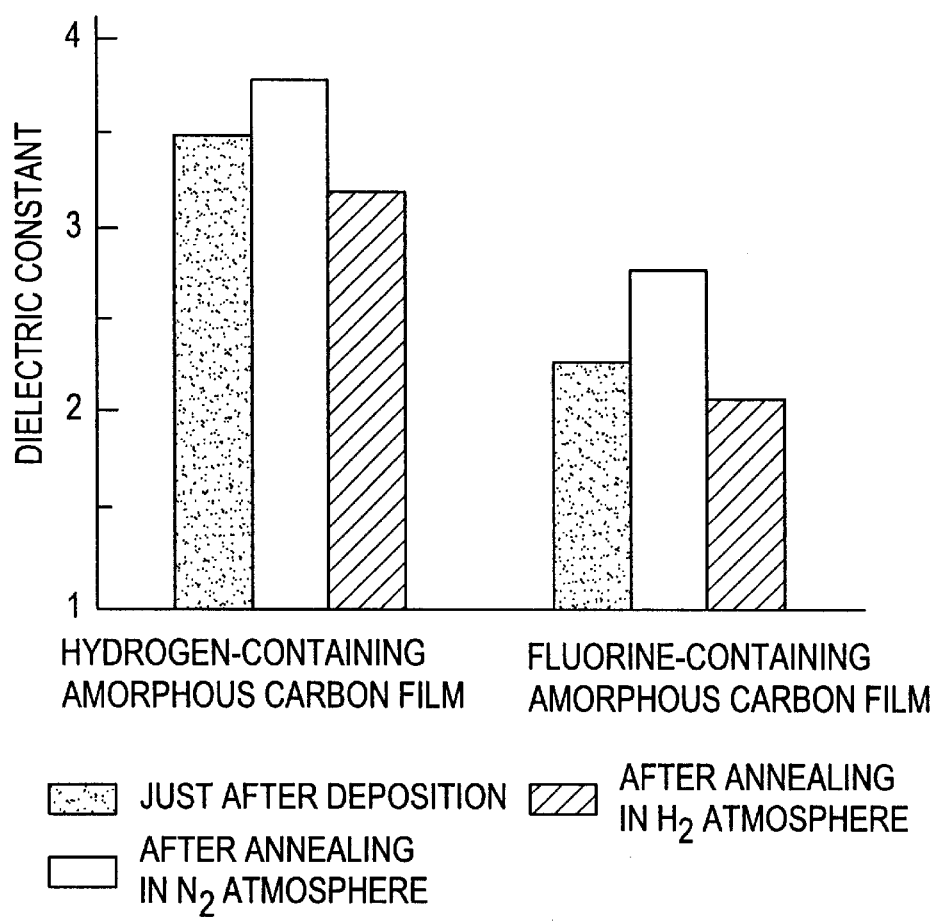
FIG. 6 is a graph showing a dielectric constant of an amorphous carbon film before and after annealing.

FIG. 6 is a graph showing how a dielectric constant of an amorphous carbon film varies before and after annealing. As is shown in FIG. 6, a hydrogen-containing amorphous carbon film having been annealed in nitrogen atmosphere had a dielectric constant of 3.5 before annealing, but had an increased dielectric constant of 3.8 after annealing. A result such as this that gas discharge can be suppressed, and that a dielectric constant is increased by annealing, is common to samples in which annealing was carried out in an inert gas atmosphere such as argon atmosphere, or in vacuum atmosphere (the second sample).

Contrary to the above-mentioned first to third reference samples, the second silicon dioxide film 104 was not peeled off in an annealing step, and a dielectric constant of the hydrogen-containing amorphous carbon film 103 was not increased in the sample in which the annealing was carried out in a hydrogen atmosphere in accordance with the present invention. That is, the gas spectrum obtained by the above-mentioned temperature-up desorption process for the product having been annealed in a hydrogen atmosphere is the same as the gas spectrum illustrated in FIG. 5. A peak of the gas discharge at about 200 degrees centigrade was not found.

In addition, as illustrated in FIG. 6, a dielectric constant found after annealing of a the sample in accordance with the present invention was reduced to about 3.2 from a dielectric constant before annealing of about 3.5. This result is quite desired for the hydrogen-containing amorphous carbon film 103, because it is important for an interlayer insulating film to have a low dielectric constant.

Though the conditions for carrying out annealing in the first example were set at an atmospheric pressure at 400 degrees centigrade for 1 hour, the conditions are variable. However, with respect to an annealing temperature, it is desired that an annealing temperature is equal to or greater than 200 degrees centigrade, preferably 250 degrees centigrade, for the purpose of suppressing a peak of gas discharge which is found at about 200 degrees centigrade.

Furthermore, since decomposition of the hydrogen-containing amorphous carbon film 103 begins at about 450 degrees centigrade, an upper limit of an annealing temperature has to be lower than 450 degrees centigrade. A period of annealing time is dependent on an annealing temperature, and hence, it takes a shorter period of annealing time in a higher annealing temperature.

In the first example, $CH_4$ gas is selected as a process gas for depositing the hydrogen-containing amorphous carbon film 103. However, it should be noted that other hydrocarbon gases such as $C_2H_6$, $C_3H_8$, $C_2H_4$, $C_2H_2$, $C_6H_6$, toluene, and xylene might be selected for depositing the hydrogen-containing amorphous carbon film 103. The hydrogen-containing amorphous carbon film 103 made from the above-mentioned gases provides the same advantages as the advantages obtained by the hydrogen-containing amorphous carbon film 103 made from $CH_4$.

Though the upper film 104 illustrated in FIG. 1 is formed as the second silicon dioxide film having been deposited by PCVD in the first example, a material of which the upper film 104 is composed and a method by which the upper film 104 is made are not to be limited to those having been explained in the first example. For instance, the upper film 104 may be formed as a silicon nitrogen film deposited by PCVD, a thin aluminum film deposited by sputtering, a thin copper film, a titanium film, a thin titanium nitride film, a tantalum film, a tantalum nitride film, a cobalt film, a tungsten film, a silicone film, a titanium silicide film, a tungsten silicide film, or a cobalt silicide film. The multi-layered wiring structure including one of the above-listed films deposited on the hydrogen-containing amorphous carbon film 103 provides the same advantages as those of the first example.

[Second Example]

In the second example, an amorphous carbon film deposited in accordance with the present invention is formed with via-holes, and each of the via-holes is filled with a plug electrode for making electrical connection between upper and lower wiring layers in a multi-layered wiring structure.

FIGS. 7A to 7F show respective steps for making a plug electrode.

Figure 7A:
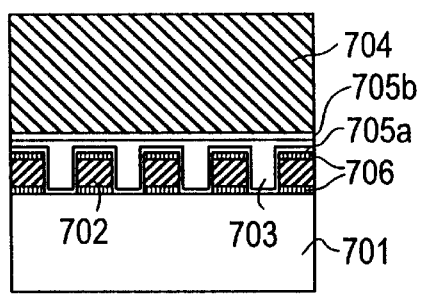
FIGS. 7A to 7F illustrate steps to be carried out for forming via-holes through a hydrogen-containing amorphous carbon film and filling the via-holes with aluminum plug.

First, as illustrated in FIG. 7A, aluminum wiring layers 702 were formed on a silicon substrate 701 with the aluminum wiring layers 702 being sandwiched between titanium nitride layers 706. Then, the aluminum wiring layers 702 and the silicon substrate 701 were covered with a first silicon dioxide film 705*a*. Then, a hydrogen-containing amorphous carbon film 703 was deposited over the first silicon dioxide film 705*a* so that spaces between the aluminum wiring layers 702 were filled with the hydrogen-containing amorphous carbon film 703.

Then, a resultant was annealed at 400 degrees centigrade in hydrogen atmosphere for 1 hour to thereby reduce an amount of discharged gas and a dielectric constant thereof. Then, a second silicon dioxide film 705*b* was deposited on the hydrogen-containing amorphous carbon film 703. Then, a silicon dioxide film 704 was deposited on the second silicon dioxide film 705*b* by a thickness of 2 micron. The steps having been carried out so far were the same as the steps of the first example.

Figure 7D:
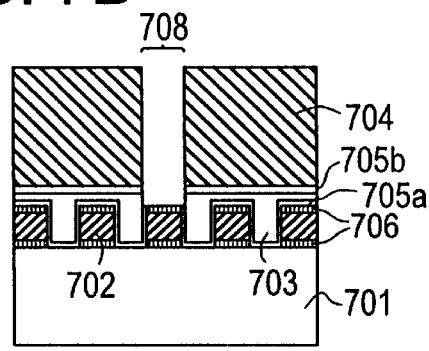
Figure 7B:
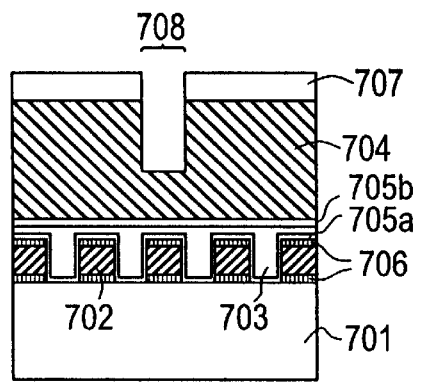

Then, the silicon dioxide film 704 was planarized by chemical mechanical polishing (CMP). Then, a photoresist film 707 was applied onto the silicon dioxide film 704, followed by dry etching of the silicon dioxide film 704 using $CHF_3$ gas to thereby form a via-hole 708, as illustrated in FIG. 7B. The silicon dioxide film 704 was dry-etched so that the via-hole 708 had a depth within a thickness of the silicon dioxide film 704.

Figure 7E:
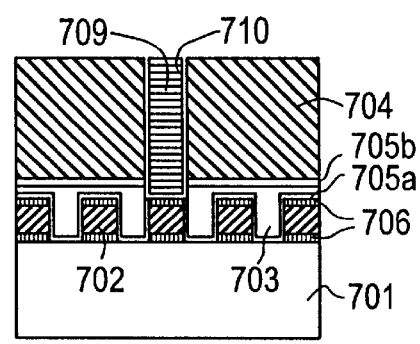
Figure 7C:
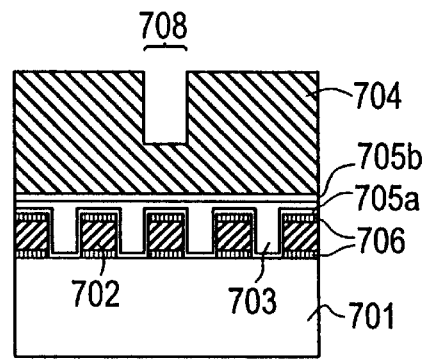

Thereafter, as illustrated in FIG. 7C, the photoresist film 704 was ashed for removal.

Then, the silicon dioxide film 704, a second silicon dioxide film 705*b* as a second cover film, and the hydrogen-containing amorphous carbon film 703 were dry-etched again until the via-hole 708 reached the lower aluminum wiring layer 702. This dry etching was carried out using $CHF_3$ and $O_2$ gases with the silicon dioxide film 704 being used as a hard mask. Thus, as illustrated in FIG. 7D, there was formed the via-hole 708 passing through the silicon dioxide film 704, the second silicon dioxide film 705*b*, and the hydrogen-containing amorphous carbon film 703, and reaching the aluminum wiring layer 702.

Then, a titanium nitride film 710 was deposited on an inner wall of the via-hole 708 at a substrate temperature of 200 degrees centigrade. Subsequently, the via-hole 708 was filled with aluminum plug 709 by CVD at a substrate temperature of 200 degrees centigrade, as illustrated in FIG. 7E.

Figure 7F:
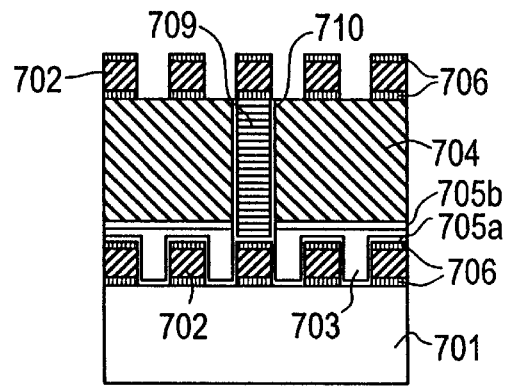

Then, as illustrated in FIG. 7F, a titanium nitride film 706, an aluminum wiring layer 702, and a titanium nitride film 706 were deposited in this order on the silicon dioxide film 704 by sputtering, and were patterned into an upper wiring layer.

Thus, there was completed a two-layered wiring structure in which the lower and upper aluminum wiring layers 702 were electrically connected to each other. In fabrication of the two-layered wiring structure, there were not found defects such as a film peeling-off between the hydrogen-containing amorphous carbon film 703 and the silicon dioxide film 704, and poisoned via, even if the structure was subject to annealing.

Figure 8:
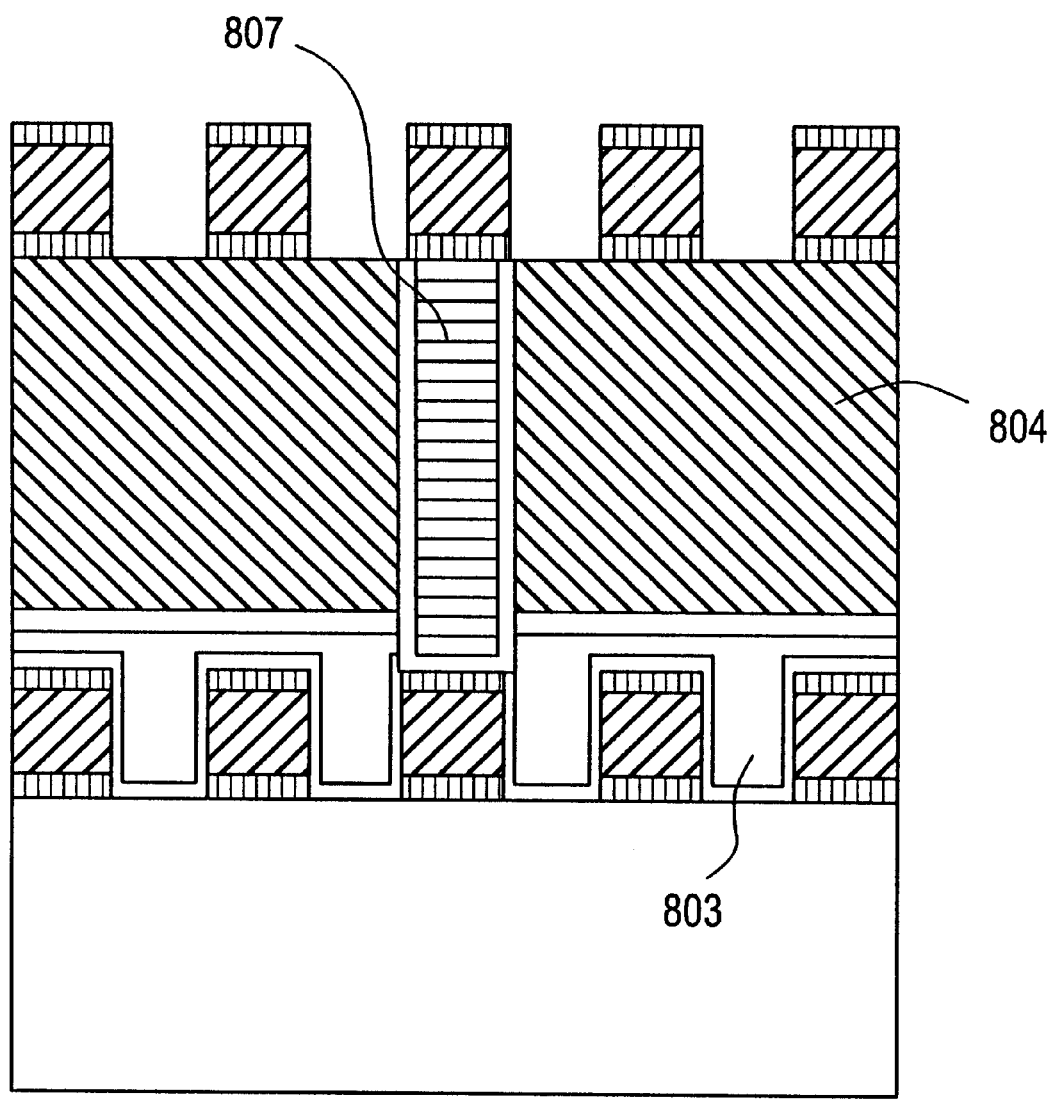
FIG. 8 is a cross-sectional view of a multi-layered wiring structure including a hydrogen-containing amorphous carbon film and tungsten plug with which via-holes are filled.

FIG. 8 illustrates a variant of the two-layered wiring structure illustrated in FIG. 7. The two-layered wiring structure illustrated in FIG. 8 is different from the two-layered wiring structure illustrated in FIG. 7 only in that the aluminum plug 709 is replaced with a tungsten plug 807. In the two-layered wiring structure illustrated in FIG. 8, there were not found defects such as a film peeling-off between the hydrogen-containing amorphous carbon film 803 and the silicon dioxide film 804, and poisoned via, even if the structure was subject to annealing, similarly to the two-layered wiring structure illustrated in FIG. 7.

The tungsten plug 807 was deposited at a substrate temperature of 400 degrees centigrade, using $WF_6$ and $SiH_4$ gases as process gases. Hence, it has been found out that there is no generation of any defects in annealing to be carried out at about 400 degrees centigrade which is approximately equal to a decomposition point of the hydrogen-containing amorphous carbon film 804, if a multi-layered wiring structure is in advance subject to annealing in hydrogen atmosphere.

Though the two-layered wiring structure are explained in the first and second examples, a three or more layered wiring structure may be fabricated by repeating the above-mentioned steps as illustrated in FIGS. 7A to 7F.

[Third Example]

In the third example, a hydrogen-containing amorphous carbon film is formed with recesses, and the recesses are filled with a metal film which is then polished at a surface to thereby form a wiring in the recesses.

FIGS. 9A to 9G illustrate respective steps of a method of forming a wiring structure.

Figure 9A:
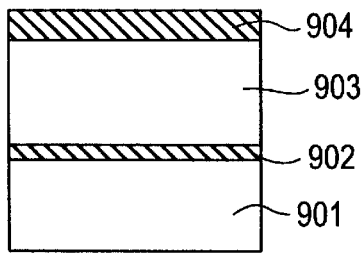
FIGS. 9A to 9G illustrate steps to be carried out for forming a wiring in recessed portions formed with a hydrogen-containing amorphous carbon film.

First, as illustrated in FIG. 9A, a silicon dioxide film 902 was deposited on a substrate 901 by a thickness of 50 nm. Then, a hydrogen-containing amorphous carbon film 903 was deposited on the silicon dioxide film 902 by a thickness of 600 nm. Then, the hydrogen-containing amorphous carbon film 903 was annealed at 400 degrees centigrade in hydrogen atmosphere for 1 hour. Then, a silicon dioxide film 904 was deposited on the hydrogen-containing amorphous carbon film 903 by a thickness of 100 nm.

Figure 9B:
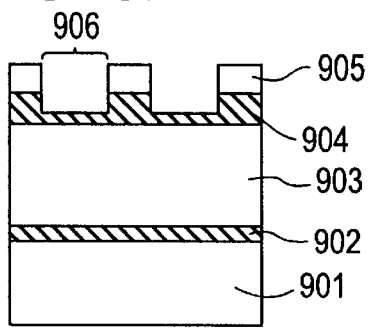

Then, as illustrated in FIG. 9B, a photoresist film 905 was applied onto the silicon dioxide film 904, and then, patterned into a desired pattern. Then, the silicon dioxide film 904 was etched with the patterned photoresist film 905 being used as a mask.

Figure 9C:
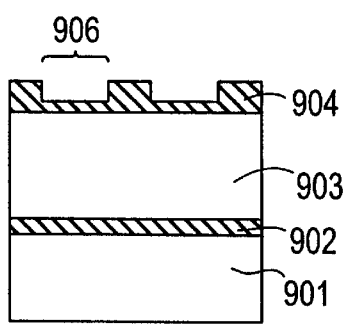

Then, the photoresist film 905 was removed. Thus, as illustrated in FIG. 9C, the silicon dioxide film 904 was formed with recesses 906.

Figure 9D:
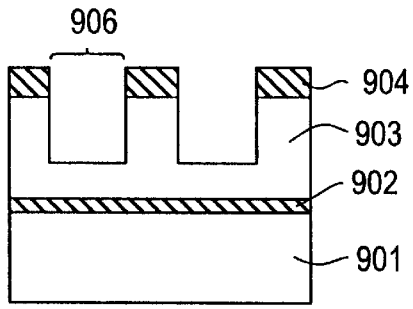

Then, the hydrogen-containing amorphous carbon film 903 was etched with the silicon dioxide film 904 being used as a hard mask. The silicon dioxide film 904 was etched in such a manner that the recesses or trenches 906 did not reach the silicon dioxide film 902. Thus, as illustrated in FIG. 9D, there were formed trenches 906 through the silicon dioxide film 904 and the hydrogen-containing amorphous carbon film 903. Each of the trenches 906 had a depth of 0.6 micron and a width of 0.5 micron.

Figure 9E:
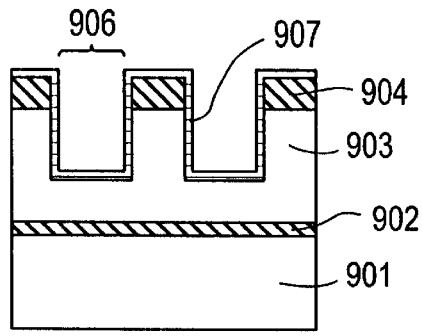

Then, as illustrated in FIG. 9E, a tantalum nitride film 907 was deposited on an inner wall of the trenches 906 by a thickness of 50 nm by sputtering.

Figure 9F:
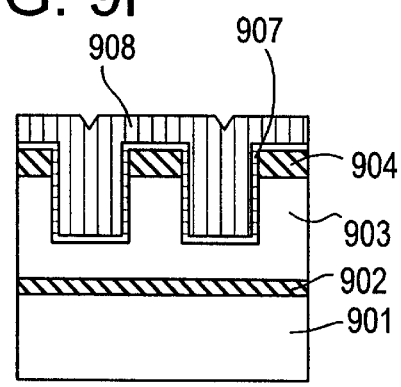

Then, as illustrated in FIG. 9F, copper 908 was deposited over a product resulted from the step illustrated in FIG. 9E so that the trenches 906 were filled with copper.

Figure 9G:
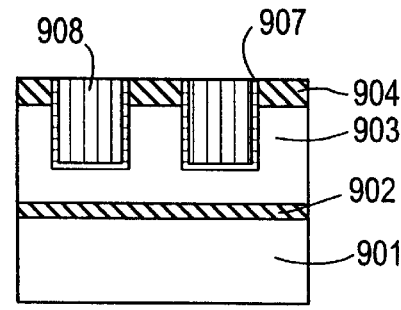

Then, as illustrated in FIG. 9G, the copper film 908 was partially removed by CMP so that the copper film 908 remained unremoved only in the trenches 906. Thereafter, a product was subject to final annealing at 400 degrees centigrade in vacuum atmosphere for 1 hour.

There was no peeling-off of the silicon dioxide film 904 even in the final annealing.

As mentioned so far, it is possible to enhance heat-resistance of the hydrogen-containing amorphous carbon film 903 by annealing to be carried out before deposition of films on the hydrogen-containing amorphous carbon film 903. In particular, it is possible to reduce a dielectric constant of hydrogen-containing amorphous carbon film 903 by carrying out annealing in hydrogen atmosphere.

Spin density in the hydrogen-containing amorphous carbon film 903 was inspected by electron spin resonance (ESR). It was found out that if the hydrogen-containing amorphous carbon film 903 was subject to annealing in hydrogen atmosphere, spin density in a the film was decreased, but if the hydrogen-containing amorphous carbon film 903 was subject to annealing in inert gas atmosphere, spin density in the film was increased.

In addition, an amount of hydrogen which was residual in the hydrogen-containing amorphous carbon film 903 after carrying out annealing in a hydrogen atmosphere was measured by a hydrogen forward scattering process. It was found that no hydrogen was residual in the hydrogen-containing amorphous carbon film 903 after annealing.

Thus, it is considered that reduction in spin density achieved by carrying out annealing in hydrogen atmosphere is not caused by that non-bonded hands in the hydrogen-containing amorphous carbon film 903 are terminated with hydrogen atoms, but caused by that free radicals trapped in the hydrogen-containing amorphous carbon film 903 are removed.

On the other hand, it is considered that an increase in spin density brought by annealing in other gases is caused by residual free radicals in the hydrogen-containing amorphous carbon film 903. Accordingly, it is possible to remove polarization caused by orientation of free radicals by carrying out annealing in a hydrogen atmosphere, and reduce a dielectric constant of the hydrogen-containing amorphous carbon film 903.

This result is common to second to fourth embodiments mentioned hereinbelow.

[Second Embodiment]

In the second embodiment, there is employed a fluorine-containing amorphous carbon film as an interlayer insulating film with which spaces formed between wiring layers are filled. When a fluorine-containing amorphous carbon film is employed as an interlayer insulating film, it is possible to prevent peeling-off of a film to be deposited on a fluorine-containing amorphous carbon film, and further prevent an increase in a dielectric constant of a fluorine-containing amorphous carbon film, by annealing the fluorine-containing amorphous carbon film in a hydrogen atmosphere.

Hereinbelow are explained the fourth to sixth examples as detailed examples of the second embodiment.

[Fourth Example]

A multi-layered wiring structure in accordance with the fourth example has the same structure as that of the first embodiment illustrated in FIG. 1 except that the fourth example includes a fluorine-containing amorphous carbon film in place of the hydrogen-containing amorphous carbon film 103.

Hereinbelow is explained steps of a method of fabricating the multi-layered wiring structure in accordance with the fourth example.

First, a lower aluminum wiring layer was formed on a substrate on which devices such as transistors had been fabricated. The lower aluminum wiring layer was formed sandwiched between titanium nitride films. Then, the lower aluminum wiring layers and the substrate were entirely covered with a silicon dioxide film with an upper surface which is made silicon-richer. The steps having been carried out so far were the same as the steps of the first embodiment.

Then, a fluorine-containing amorphous carbon film was deposited on the silicon dioxide film. The fluorine-containing amorphous carbon film was deposited by means of a helicon wave type PCVD apparatus illustrated in FIG. 10.

Figure 10:
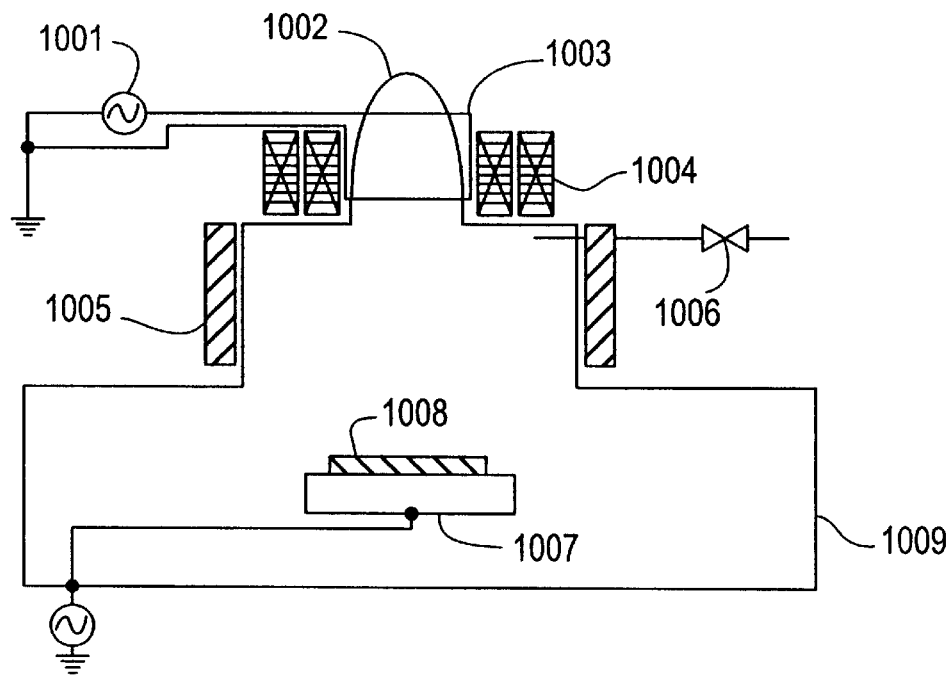
FIG. 10 is a schematic view illustrating a helicon wave type plasma-enhanced chemical vapor deposition apparatus.

The helicon wave type PCVD apparatus illustrated in FIG. 10 is comprised of a vacuum chamber 1009, a quartz bell-jar 1002 located on top of the vacuum chamber 1009, an antenna 1003 wound around the bell-jar 1002, an electromagnet 1004 arranged around the bell-jar 1002, a high frequency power source 1001 for supplying high frequency power to the antenna 1003, permanent magnets 1005 for applying a magnetic field to the vacuum chamber 1009, and a sample holder 1007 located in the vacuum chamber 1009.

The vacuum chamber 1009 is formed with a gas inlet 1006 through which process gases are introduced into the vacuum chamber 1009. A specimen wafer 1008 is placed on the sample holder 1007.

As a process gas was employed $C_4F_8$, or a mixture gas including $C_4F_8$ and $CH_4$ or $H_2$. A flow rate of $C_4F_8$ gas was set at 155 sccm when only $C_4F_8$ gas was employed, and flow rates of $C_4F_8$ and $CH_4$ gases were set at 50 sccm and 50 sccm, respectively, when a mixture gas of them was employed. A substrate temperature was set at 100 degrees centigrade, and discharge power was set at 2 kW. In addition, a bias of 30 W was applied to the substrate for enhancing coverage of the fluorine-containing amorphous carbon film into spaces formed between the lower aluminum wiring layers.

In order to enhance adhesion between the fluorine-containing amorphous carbon film and the first and second cover films, a deposition pressure or a ratio of $CH_4$ gas flow rate to $C_4F_8$ gas flow rate ($C_4F_8/CH_4$) was varied at initial and final stages in deposition of the fluorine-containing amorphous carbon film to thereby locally reduce a fluorine content of the fluorine-containing amorphous carbon film at interfaces between the fluorine-containing amorphous carbon film and the first and second cover films.

The fluorine-containing amorphous carbon film was deposited in the above-mentioned conditions in the fourth example. The deposited fluorine-containing amorphous carbon film had a dielectric constant of 2.3 when only $C_4F_8$ gas was employed as a process gas, and a dielectric constant of 2.5 when a mixture gas of $C_4F_8$ and $CH_4$ was employed as a process gas. The fluorine-containing amorphous carbon film was composed of carbon and fluorine when only $C_4F_8$ gas was employed as a process gas, and composed of carbon, fluorine and hydrogen when a mixture gas of $C_4F_8$ and $CH_4$ was employed as a process gas.

An apparatus for depositing a fluorine-containing amorphous carbon film is not to be limited to the apparatus illustrated in FIG. 10. For instance, there may be employed other CVD apparatuses such as a parallel plate type one, an inductive coupling one, and ECR type one.

In addition, there may be employed process gases other than $C_4F_8$. For instance, there may be employed fluorinated carbon gas such as $CF_4$, $C_2F_6$, $C_3F_8$, and $C_6F_6$, aromatic fluorinated carbon gas such as fluorinated toluene and fluorinated xylene, or other fluorinated carbon gases.

Following deposition of the fluorine-containing amorphous carbon film, the fluorine-containing amorphous carbon film was subject to annealing in hydrogen atmosphere. The apparatus for annealing the fluorine-containing amorphous carbon film was the same as the apparatus employed in the first example, illustrated in FIG. 3. In addition, the annealing conditions were the same as the annealing conditions in the first example. Namely, the annealing in hydrogen atmosphere was carried out in the following conditions.

Pressure: atmospheric pressure
Temperature: 400 degrees centigrade
Time: 1 hour

Similar to the first example, there were also made two samples for reference. In the first reference sample, a fluorine-containing amorphous carbon film was subject to annealing in a nitrogen atmosphere, and in the second reference sample, a fluorine-containing amorphous carbon film was formed without being subject to annealing.

Following the annealing in a hydrogen atmosphere, a silicon dioxide film was deposited on the fluorine-containing amorphous carbon film, similarly to the first example. The silicon dioxide film was formed silicon-richer at an interface with the fluorine-containing amorphous carbon film for enhancing adhesion therebetween.

Then, the multi-layered wiring structures in accordance with the fourth example and reference samples were annealed at 400 degrees centigrade in vacuum for 1 hour. The results are as follows.

In the second reference sample in which the fluorine-containing amorphous carbon film was formed without carrying out annealing, it was found that the silicon dioxide film deposited on the fluorine-containing amorphous carbon film was peeled off regardless of whether methane gas was added to a process gas for depositing the fluorine-containing amorphous carbon film.

Figure 11:
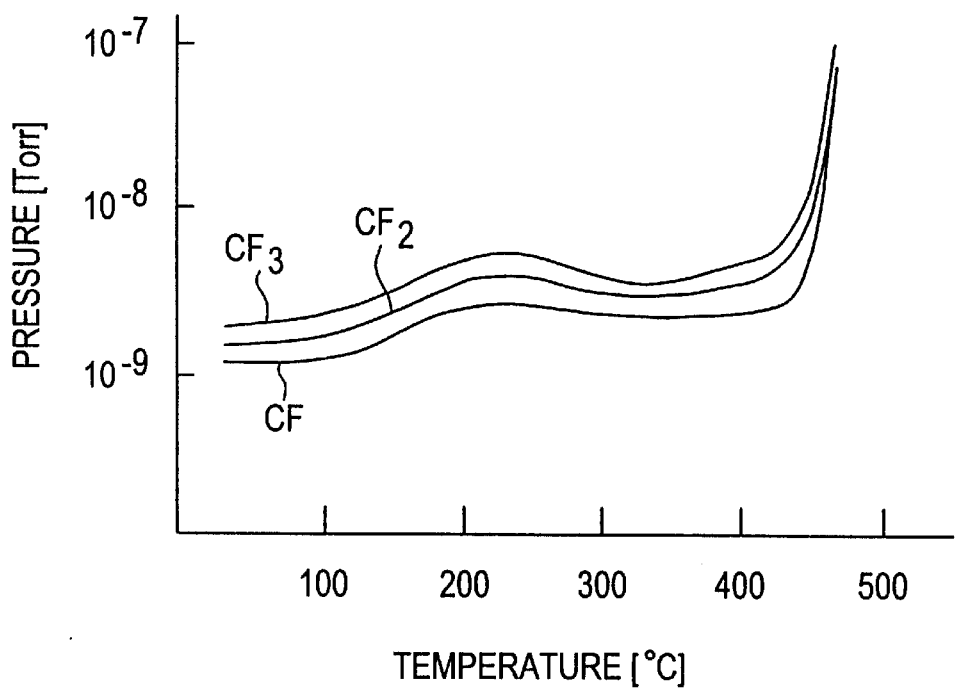
FIG. 11 is a spectrum showing how gas is desorped out of a fluorine-containing amorphous carbon film immediately after deposition thereof.

FIG. 11 illustrates a gas spectrum obtained by the above-mentioned temperature-up desorption process for the fluorine-containing amorphous carbon film in the second reference sample, which film has been formed using only $C_4F_8$ gas without addition of $CH_4$ gas thereto.

Similar to the first example, gas discharge from the fluorine-containing amorphous carbon film is observed at about 200 degrees centigrade. Herein, the discharges gas is $CF_3$, $CF_2$ and CF. It was found that HF gas was also discharged, though slightly, as well as CF3, $CF_2$ and CF gases, when methane gas was also employed as a process gas in addition $C_4F_8$ gas. It was also found that an amount of gas discharged out of the fluorine-containing amorphous carbon film is greater than an amount of gas discharged out of the hydrogen-containing amorphous carbon film in the first example.

The reason why an amount of gas discharged out of the fluorine-containing amorphous carbon film significantly increases at about 450 degrees centigrade is that the fluorine-containing amorphous carbon film begins to be decomposed at that temperature.

In the first reference sample in which a fluorine-containing amorphous carbon film was annealed in a nitrogen atmosphere, peeling-off of the silicon dioxide film deposited on the fluorine-containing amorphous carbon film was not observed regardless of whether methane gas was added to a process gas for depositing the fluorine-containing amorphous carbon film.

Figure 12:
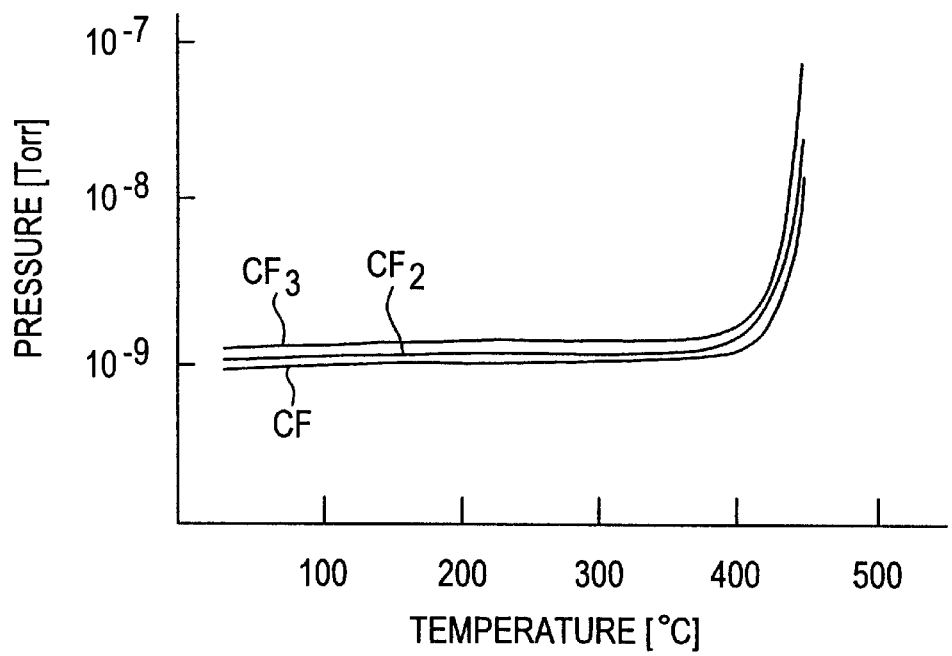
FIG. 12 is a spectrum showing how gas is desorped out of a fluorine-containing amorphous carbon film after annealing.

FIG. 12 illustrates a gas spectrum obtained by the above-mentioned temperature-up desorption process for the fluorine-containing amorphous carbon film in accordance with the first reference sample.

As is obvious in FIG. 12, gas discharge at about 200 degrees centigrade, which was observed in the second sample, is not observed. Gas discharge is observed only at 400 degrees centigrade or greater. This means that if the fluorine-containing amorphous carbon film was subject to annealing in nitrogen atmosphere to thereby cause gas to discharge out of there, a film deposited on the fluorine-containing amorphous carbon film is not peeled off in later steps.

However, the first reference sample was accompanied with a problem that a dielectric constant of the fluorine-containing amorphous carbon film was increased. As illustrated in FIG. 6, the fluorine-containing amorphous carbon film having been formed using only $C_4F_8$ gas had a dielectric constant of 2.3 immediately after deposition thereof, but had an increased dielectric constant of 2.8 after annealing. When methane gas was employed as a process gas in addition $C_4F_8$ gas, a dielectric constant of the fluorine-containing amorphous carbon film was increased to 3.0 from 2.5 by carrying out annealing in a nitrogen atmosphere.

The same result was obtained when the fluorine-containing amorphous carbon film was subject to annealing in an inert gas atmosphere such as argon atmosphere, in a fluorinated carbon gas atmosphere such as $CF_4$, $C_2F_6$ and $C_4F_8$, or in a vacuum.

Contrary to the above-mentioned reference samples, the silicon dioxide film deposited on the fluorine-containing amorphous carbon film was not peeled off in an annealing step, and a dielectric constant of the hydrogen-containing amorphous carbon film was not increased in accordance with the fourth example. That is, the gas spectrum obtained by the above-mentioned temperature-up desorption process for the fourth example is the same as the gas spectrum illustrated in FIG. 12. A peak of the gas discharge at about 200 degrees centigrade was not observed.

In addition, a dielectric constant of the fluorine-containing amorphous carbon film was decreased to 2.1 after annealing from 2.3 before annealing, when only $C_4F_8$ gas was employed as a process gas. Similarly, the dielectric constant was decreased to 2.3 after annealing from 2.5 before annealing, when $C_4F_8$ and $CH_4$ gases were employed as a process gas. This result of reduction in a dielectric constant is quite desirable for a fluorine-containing amorphous carbon film to be used as an interlayer insulating film.

Though the conditions for carrying out annealing in hydrogen atmosphere in the fourth example were set at an atmospheric pressure at 400 degrees centigrade for 1 hour, the conditions are variable. However, with respect to an annealing temperature, it is desired that an annealing temperature is equal to or greater than 200 degrees centigrade, preferably 250 degrees centigrade, for the purpose of suppressing a peak of gas discharge which is observed at about 200 degrees centigrade.

Furthermore, since decomposition of the fluorine-containing amorphous carbon film begins at about 450 degrees centigrade, an upper limit of an annealing temperature has to be lower than 450 degrees centigrade. A period of annealing time is dependent on an annealing temperature, and hence, it takes a shorter period of annealing time at a higher annealing temperature.

Though a film to be deposited on the fluorine-containing amorphous carbon film is a silicon dioxide film having been deposited by PCVD in the fourth example, a material of which the film is composed and a method by which the film is made are not to be limited to those having been explained in the fourth example. For instance, the film may be formed as a silicon nitrogen film deposited by PCVD, a thin aluminum film deposited by sputtering, a thin copper film, a titanium film, a thin titanium nitride film, a tantalum film, a tantalum nitride film, a cobalt film, a tungsten film, a silicone film, a titanium silicide film, a tungsten silicide film, or a cobalt silicide film. The multi-layered wiring structure including one of the above-listed films deposited on the fluorine-containing amorphous carbon film provides the same advantages as those of the first example.

[Fifth Example]

In the fifth example, a fluorine-containing amorphous carbon film deposited in accordance with the present invention is formed with via-holes, and each of the via-holes is filled with a plug electrode for making electrical connection between upper and lower wiring layers in a multi-layered wiring structure.

Figure 13:
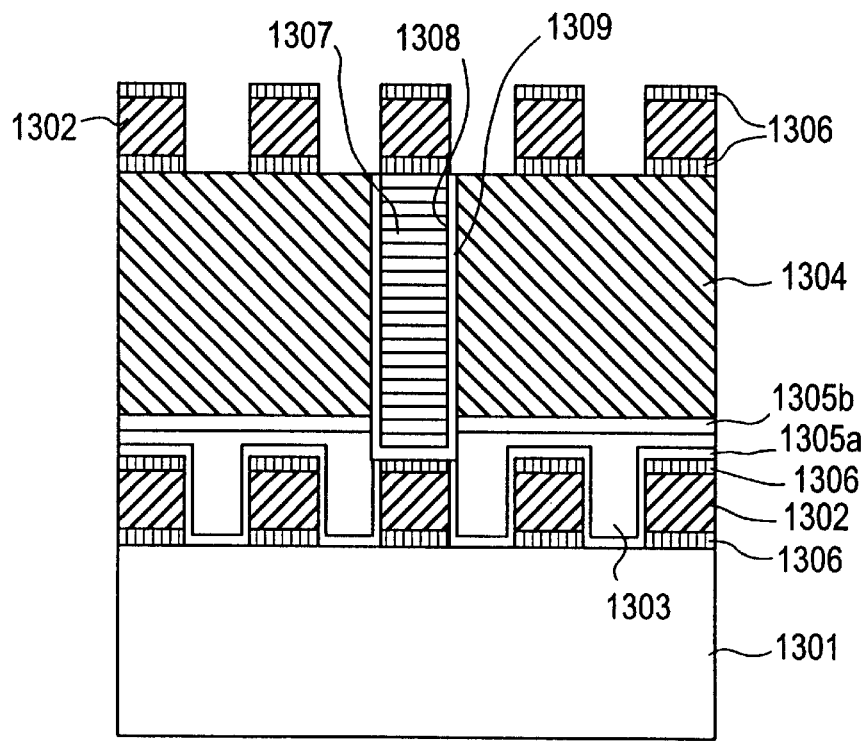
FIG. 13 is a cross-sectional view of a multi-layered wiring structure including a fluorine-containing amorphous carbon film and aluminum plug with which via-holes are filled.

FIG. 13 is a cross-sectional view of a multi-layered wiring structure in accordance with the fifth example. The multi-layered wiring structure in accordance with the fifth example is different from the multi-layered wiring structure in accordance with the second example in that an insulating film for making electrical isolation between upper and lower wiring layers is composed of a fluorine-containing amorphous carbon film.

First, aluminum wiring layers 1302 were formed on a silicon substrate 1301 with the aluminum wiring layers 1302 being sandwiched between titanium nitride layers 1306. Then, the aluminum wiring layers 1302 and the silicon substrate 1301 were covered entirely with a first cover film 1305a. Then, a fluorine-containing amorphous carbon film 1303 was deposited over the first cover film 1305a so that spaces between the aluminum wiring layers 1302 were filled with the fluorine-containing amorphous carbon film 1303.

Then, a resultant was annealed at 400 degrees centigrade in a hydrogen atmosphere for 1 hour to thereby reduce an amount of discharged gas and a dielectric constant thereof. Then, a second cover film 1305b was formed entirely over the fluorine-containing amorphous carbon film 1303. Then, a silicon dioxide film 1304 was deposited on the second cover film 1305b by a thickness of 2 micron. The steps having been carried out so far were the same as the steps of the fourth example.

Then, the silicon dioxide film 1304 was planarized by chemical mechanical polishing (CMP). Then, a photoresist film (not illustrated) was applied onto the silicon dioxide film 1304, followed by dry etching of the silicon dioxide film 1304 to thereby form a via-hole 1308. The silicon dioxide film 1304 was dry-etched so that the via-hole 1308 did not reach a bottom of the silicon dioxide film 1304.

After removal of the photoresist film, the silicon dioxide film 1304, a second cover film 1305b, and the fluorine-containing amorphous carbon film 1303 were dry-etched again until the via-hole 1308 reached the lower aluminum wiring layers 1302. This dry etching was carried out using $CHF_3$ and $O_2$ gases with the silicon dioxide film 1304 being used as a hard mask. Thus, there was formed the via-hole 1308 passing through the silicon dioxide film 1304, the second cover film 1305b, and the fluorine-containing amorphous carbon film 1303, and reaching the aluminum wiring layer 1302.

Then, a titanium nitride film 1309 was deposited on an inner wall of the via-hole 1308. Subsequently, the via-hole 1308 was filled with aluminum plug 1307 by CVD.

Then, a titanium nitride film 1306, an upper aluminum wiring layer 1302, and a titanium nitride film 1306 were deposited in this order on the silicon dioxide film 1304 by sputtering, and were patterned into a desired pattern.

Thus, there was completed two-layered wiring structure in which the lower and upper aluminum wiring layers 1302 were electrically connected to each other. In fabrication of the two-layered wiring structure, there were no defects found such as a film peeling-off between the fluorine-containing amorphous carbon film 1303 and the silicon dioxide film 1304, and poisoned via, even if the structure was subject to annealing.

Figure 14:
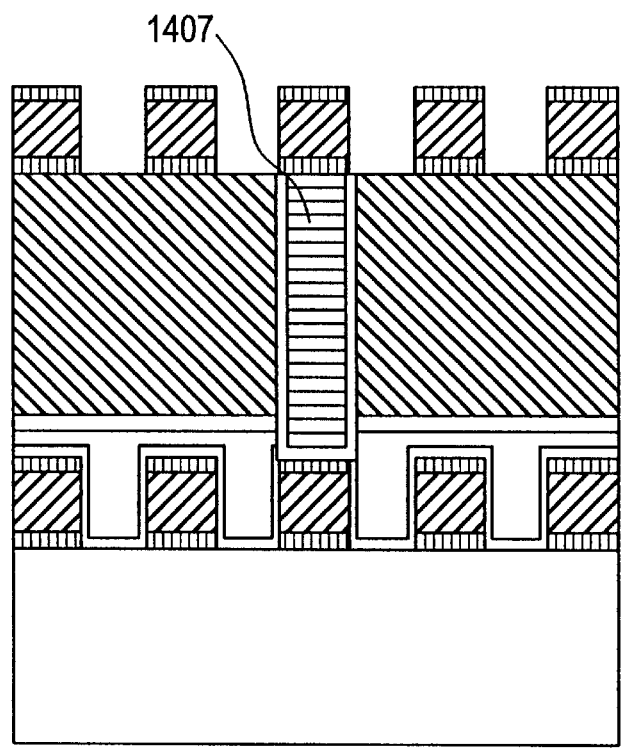
FIG. 14 is a cross-sectional view of a multi-layered wiring structure including a fluorine-containing amorphous carbon film and tungsten plug with which via-holes are filled.

FIG. 14 illustrates a variant of the two-layered wiring structure illustrated in FIG. 13. The two-layered wiring structure illustrated in FIG. 14 is different from the two-layered wiring structure illustrated in FIG. 13 only in that the aluminum plug 1307 is replaced with a tungsten plug 1407. In the two-layered wiring structure illustrated in FIG. 14, there were no defects found such as film peeling-off between the fluorine-containing amorphous carbon film and the silicon dioxide film deposited thereon, and poisoned via, even if the structure was subject to annealing, similarly to the two-layered wiring structure illustrated in FIG. 13.

The tungsten plug 1407 was deposited at a substrate temperature of 400 degrees centigrade, using $WF_6$ and $SiH_4$ gases as process gases. Hence, it has been found that no defects were generated in annealing to be carried out at about 400 degrees centigrade which is approximately equal to a decomposition point of the fluorine-containing amorphous carbon film, if a multi-layered wiring structure is in advance subject to annealing in hydrogen atmosphere.

Though the two-layered wiring structure are explained in the fifth example, a three or more layered wiring structure may be fabricated by repeating the above-mentioned steps.

[Sixth Example]

In the sixth example, a fluorine-containing amorphous carbon film is formed with recesses, and the recesses are filled with a metal film which is then polished at a surface to thereby form a wiring in the recesses.

Figure 15:
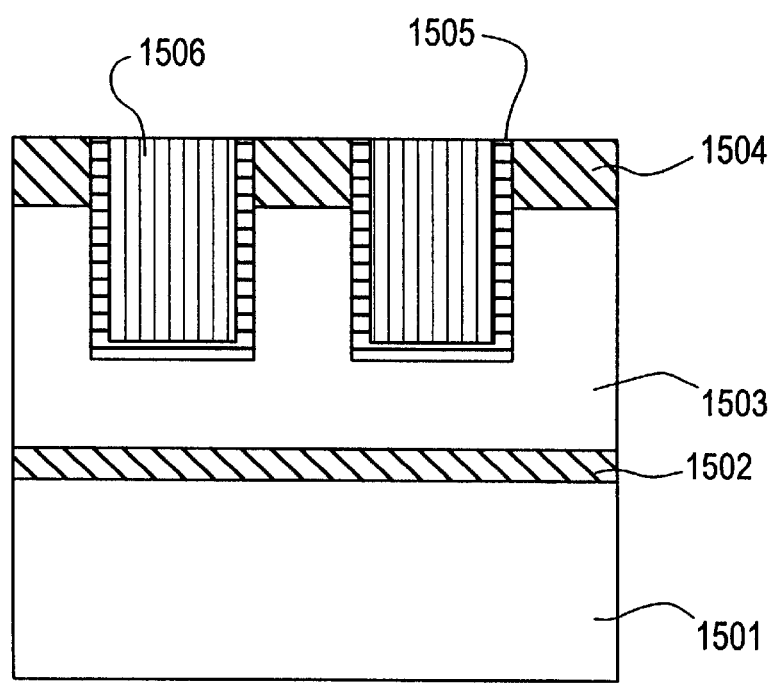
FIG. 15 is a cross-sectional view of a hydrogen-containing amorphous carbon film formed with a wiring in recessed portions thereof.

FIG. 15 is a cross-sectional view of a multi-layered wiring structure in accordance with the sixth example.

First, a silicon dioxide film 1502 was deposited on a substrate 1501 by a thickness of 50 nm. Then, a fluorine-containing amorphous carbon film 1503 was deposited on the silicon dioxide film 1502 by a thickness of 600 nm. Then, the fluorine-containing amorphous carbon film 1503 was annealed at 400 degrees centigrade in a hydrogen atmosphere for 1 hour. Then, a silicon dioxide film 1504 was deposited on the fluorine-containing amorphous carbon film 1503 by a thickness of 100 nm.

Then, there were formed recesses through the silicon dioxide film 1504 and the fluorine-containing amorphous carbon film 1503 in the same way as the above-mentioned second example. Each of the trenches 1506 had a depth of 0.6 micron and a width of 0.5 micron.

Then, a tantalum nitride film 1505 was deposited on an inner wall of the trenches 1506 by a thickness of 50 nm by sputtering.

Then, copper 1506 was deposited over a product so that the trenches 1506 were filled with copper 1506.

Then, the copper film 1506 was partially removed by CMP so that the copper film 1506 remained unremoved only in the trenches 1506. Thereafter, a product was subject to final annealing at 400 degrees centigrade in vacuum atmosphere for 1 hour.

There was no peeling-off of the silicon dioxide film 1504 found even in the final annealing.

[Third Embodiment]

In the third embodiment, an insulating film for electrically isolating upper and lower wiring layers from each other is composed of poly-p-xylylene. A poly-p-xylylene film was polymerized by thermal CVD using xylylene gas having benzene rings, as a process gas.

By annealing such a film composed of carbon family material and formed by thermal CVD, in a hydrogen atmosphere, it would be possible to prevent gas from being discharged out of the film in later steps, and further prevent film from peeling-off and reduction in a dielectric constant.

Hereinbelow is explained the seventh example as a detailed sample of the third embodiment.

[Seventh Example]

A multi-layered wiring structure in accordance with the seventh example has the same structure as that of the multi-layered wiring structure illustrated in FIG. 1 except that the interlayer insulating film 105 is composed of poly-p-xylylene. The method of fabricating the multi-layered wiring structure in accordance with the seventh example is the same as the method of fabricating the multi-layered wiring structure in accordance with the first example except the steps of forming an interlayer insulating film composed of poly-p-xylylene.

Hereinbelow are explained the method of forming an interlayer insulating film composed of poly-p-xylylene.

Figure 16:
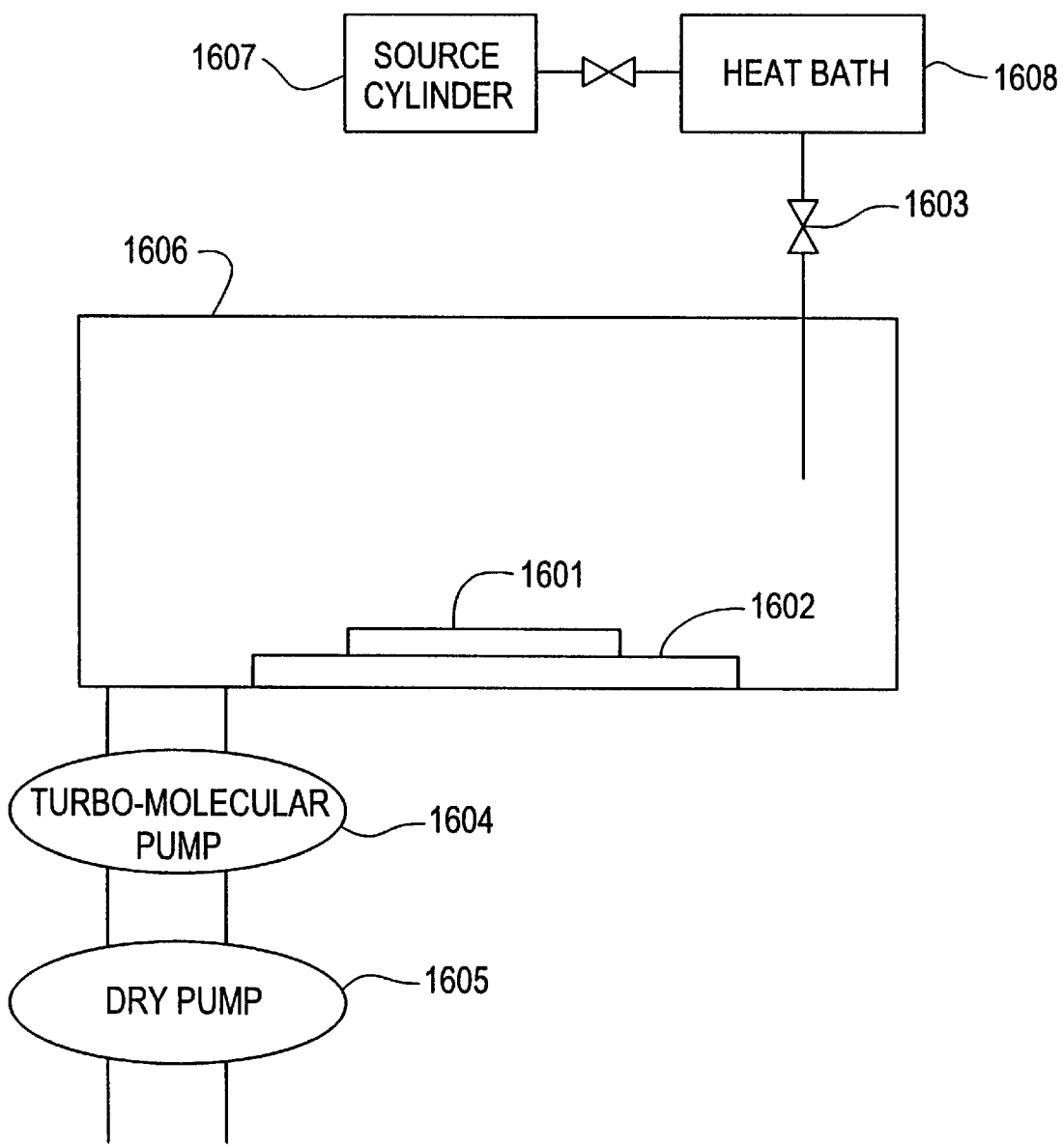
FIG. 16 is a schematic view illustrating a thermal chemical vapor deposition apparatus employed for depositing a film composed of poly-p-xylylene.

FIG. 16 illustrates an apparatus for depositing an interlayer insulating film composed of poly-p-xylylene. The illustrated apparatus is comprised of a vacuum chamber 1606 formed with a gas inlet 1603, a support table 1602 on which a substrate 1601 is placed, a turbo-molecular pump 1604 connected to the vacuum chamber 1606, a dry pump 1605 connected to the vacuum chamber 1606, a source cylinder 1607, and a heat bath 1608 heating p-xylylene supplied from the source cylinder 1607 and supplying the thus heated p-xylylene into the vacuum chamber 1606 through the gas inlet 1603.

The apparatus illustrated in FIG. 16 operates as follows.

First, p-xylylene is supplied from the source cylinder 1607 to the heat bath 1608 being kept at 700 degrees centigrade. In the heat bath 1608, p-xylylene was heated to thereby be activated, resulting in radicals being generated. Then, the thus generated radicals are introduced into the vacuum chamber 1606 through the gas inlet 1603, and deposited onto the substrate 1601.

Thus, there is formed an insulating film composed of poly-p-xylylene. The insulating film composed of poly-p-xylylene deposited in accordance with the seventh example had a dielectric constant of 2.6 immediately after deposition thereof. The insulating film was subject to annealing in a hydrogen atmosphere annealing before deposition of other films on the insulating film. The annealing in hydrogen atmosphere was carried out at 400 degrees centigrade in vacuum for 1 hour.

Two reference samples were additionally made. In the first reference sample, an annealing was carried out in nitrogen atmosphere. In the second reference sample, an insulating film was formed without carrying out annealing.

The insulating films in accordance with the seventh example and the two reference samples were tested as to whether a film deposited on the insulating films was peeled off when heated at 400 degrees centigrade in vacuum.

In the second reference sample in which the insulating film was formed without annealing, a silicon dioxide film deposited on the insulating film was peeled off.

Figure 17:
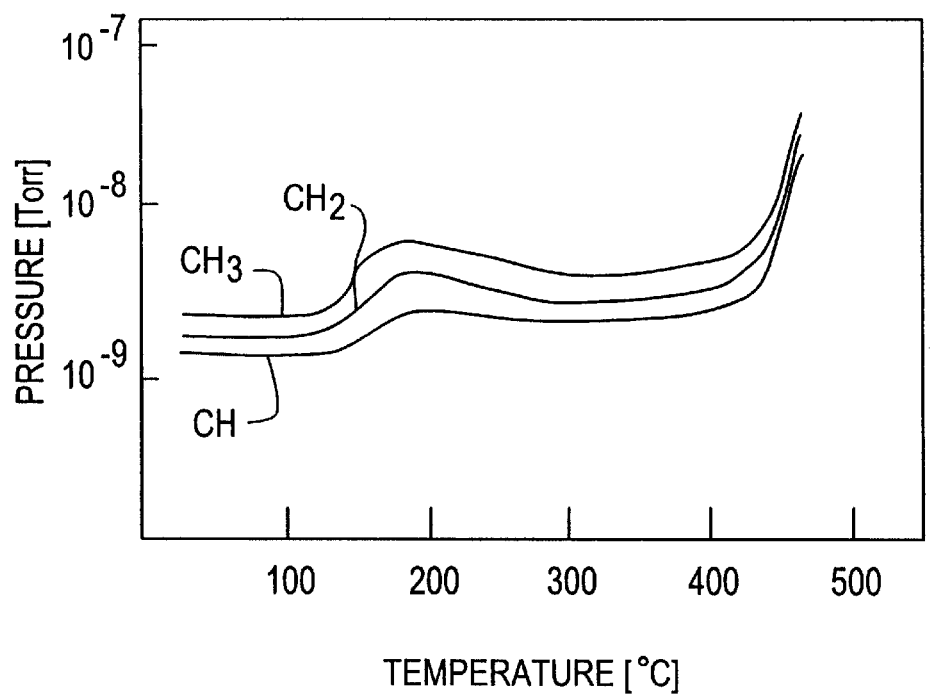
FIG. 17 is a spectrum showing how gas is desorped out of a poly-p-xylylene film immediately after deposition thereof.

FIG. 17 illustrates gas a spectrum obtained by the above-mentioned temperature-up desorption process for the insulating film in accordance with the second reference sample. It is understood in view of FIG. 17 that gases start to be discharged at about 150 degrees centigrade, and the gas discharge reaches a peak at about 200 degrees centigrade, similarly to the first example. Since the insulating film composed of poly-p-xylylene begins to be decomposed at about 450 degrees centigrade, an amount of discharged gas significantly increases at about 450 degrees centigrade.

In the first reference sample in which the insulating film was annealed in a nitrogen atmosphere, peeling-off of a silicon dioxide film deposited on the insulating film was not observed regardless of addition of methane gas as a process gas.

Figure 18:
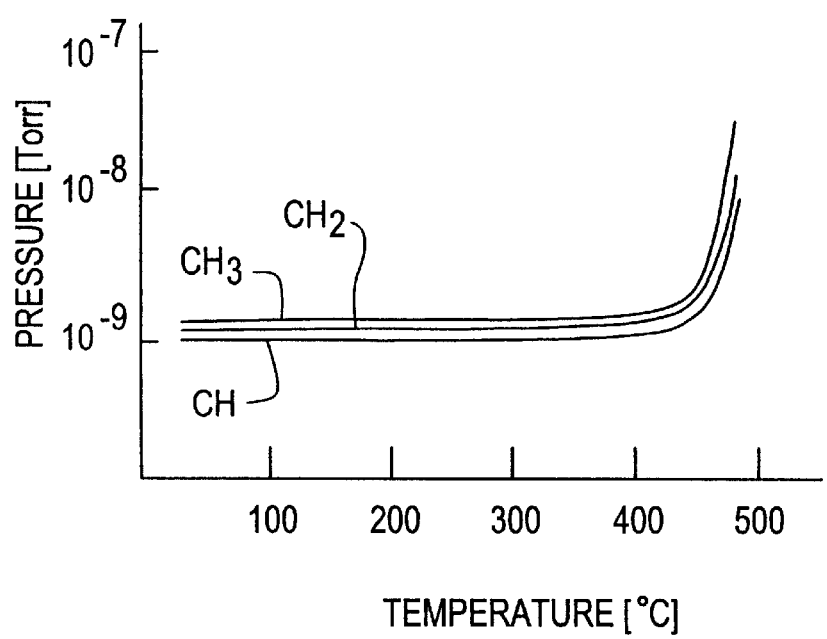
FIG. 18 is a spectrum showing how gas is desorped out of a poly-p-xylylene film after annealing.

FIG. 18 illustrates a gas spectrum obtained by the above-mentioned temperature-up desorption process for the insulating film in accordance with the first reference sample. It is understood in view of FIG. 18 that gas discharge at about 200 degrees centigrade, which was found in the second reference sample having been made without carrying out annealing, was not found, and was found only at 400 degrees centigrade or greater.

As a result, it is understood that film peeling-off in later steps can be prevented by annealing the insulating film in a nitrogen atmosphere to thereby discharge gas out of the insulating film.

However, the first reference sample was accompanied with a problem of an increase in a dielectric constant. The insulating film having been annealed in nitrogen atmosphere had a dielectric constant of 2.6 before annealing, but had an increased dielectric constant of 3.0 after annealing. A result that gas discharge can be suppressed, but a dielectric constant is increased by annealing, is common to cases in which annealing was carried out in inert an gas atmosphere such as an argon atmosphere, or in a vacuum atmosphere (the second reference sample).

Contrary to the above-mentioned reference samples, a silicon dioxide film deposited on the insulating film was not peeled off even in an annealing step, and a dielectric constant of the insulating film was not increased in the seventh example. That is, the gas spectrum obtained by the above-mentioned temperature-up desorption process for the seventh example is the same as the gas spectrum illustrated in FIG. 18. A peak of the gas discharge at about 200 degrees centigrade was not observed.

In addition, a dielectric constant of the insulating film was decreased to 2.3 after annealing from 2.6 before annealing. This result of reduction in a dielectric constant is quite desirable for the insulating film in accordance with the seventh example, because an interlayer insulating film is generally required to have a dielectric constant as small as possible.

Though the conditions for carrying out annealing in hydrogen a atmosphere in the instant example were set at an atmospheric pressure at 400 degrees centigrade for 1 hour, the conditions are variable. However, with respect to an annealing temperature, it is desired that an annealing temperature is equal to or greater than 200 degrees centigrade, preferably 250 degrees centigrade, for the purpose of suppressing a peak of gas discharge which is observed at about 200 degrees centigrade.

Furthermore, since decomposition of the insulating film composed of poly-p-xylylene begins at about 450 degrees centigrade, an upper limit of an annealing temperature has to be lower than 450 degrees centigrade. A period of annealing time is dependent on an annealing temperature, and hence, it takes a shorter period of annealing time at a higher annealing temperature.

As a variant of the above-mentioned seventh example, there was formed an interlayer insulating film composed of α, α, α', α'-tetrafluoro-p-xylylene in place of poly-p-xylylene. The interlayer insulating film as a variant provides the same advantages as those of the seventh example.

The above-mentioned seventh example is an embodiment in which an interlayer insulating film composed of poly-p-xylylene is deposited on a first wiring layer, and a first insulating film composed of a material different from poly-p-xylylene is deposited on the interlayer insulating film. It has been found out that the same advantages as those obtained by the seventh example can be obtained for a structure in which a second wiring layer is deposited on the first insulating film, a second interlayer insulating film composed of poly-p-xylylene is deposited on the second wiring layer, and a second insulating film composed of a material different from poly-p-xylylene is deposited on the second interlayer insulating film.

It would be obvious for those skilled in the art that a three or more-layered wiring structure obtained by repeating the steps of the seventh example could provide the same advantages.

It has been also found that defects such as poisoned via can be prevented in a structure in which an interlayer insulating film composed of poly-p-xylylene is formed with via-holes, which are filled with plug electrodes to make electrical connection between upper and lower wiring layers.

In addition, in a structure where an interlayer insulating film composed of poly-p-xylylene is formed with recesses, in which copper wirings are to be formed, a film deposited on the interlayer insulating film could be prevented from being peeled off by annealing the interlayer insulating film in advance, and then, forming the interlayer insulating film with recesses.

[Fourth Embodiment]

In the fourth embodiment, an interlayer insulating film is composed of polyimide. This aromatic polyimide film is formed by depositing precursor of polyimide by spin coating, and annealing the precursor. It is possible to prevent film peeling-off caused by gas discharge and reduction in a dielectric constant of an interlayer insulating film in later steps by annealing the interlayer insulating film composed of polyimide in a hydrogen atmosphere before depositing a film on the interlayer insulating film.

Hereinbelow is explained the eighth example as detailed examples of the fourth embodiment.

[Eighth Example]

A multi-layered wiring structure in accordance with the eighth example is different from the multi-layered wiring structure illustrated in FIG. 1 only in that the interlayer insulating film 105 is composed of a polyimide film. In addition, a method of fabricating the multi-layered wiring structure in accordance with the eighth example is the same as the method having been explained in the first example except the steps of forming a polyimide film.

Hereinbelow are explained the steps of forming a polyimide film.

In the eighth example, the polyimide film was made from pyromellitic acid (PMDA) and 4, 4'-diaminodiphenylether (DDE). Precursor of polyimide including a mixture of those materials was applied onto a substrate by spin coating, followed by annealing at 100 degrees centigrade in a nitrogen atmosphere for 1 hour and at 350 degrees centigrade in a nitrogen atmosphere for 1 hour, to thereby deposit an aromatic polyimide film on the substrate.

The thus formed polyimide film had a dielectric constant of 3.2 immediately after deposition thereof.

The polyimide film was subject to annealing before depositing a film on the polyimide film. The polyimide film was annealed at 400 degrees centigrade in vacuum for 1 hour. There were also two reference samples made. In the first reference sample, the polyimide film was annealed in nitrogen atmosphere, and in the second reference sample, the polyimide film was deposited without carrying out annealing.

After fabricating the multi-layered wiring structures each including the polyimide film made in accordance with the eighth example and the first and second reference samples, the multi-layered wiring structures were tested as to whether a film deposited on the polyimide film was peeled off when annealed at 400 degrees centigrade in vacuum.

It was found in the second reference sample that a film deposited on the polyimide film was peeled off. Inspecting a gas spectrum obtained by the above-mentioned temperature-up desorption process for the second reference sample, desorption of $CH_3$ was observed, which was considered to be caused by decomposition of the polyimide film or non-reacted molecules.

Solvent used for applying precursor of polyimide onto a substrate was all volatilized at annealing having been carried out at 350 degrees centigrade for depositing the polyimide film. Hence, the solvent was not observed in the test annealing carried out in a vacuum.

It was found in the first reference sample that a film deposited on the polyimide film was not peeled off. Inspecting a gas spectrum obtained for the first reference sample, a peak of gas discharge at about 200 degrees centigrade was not observed, and only gas discharge at 400 degrees centigrade, caused by decomposition of the polyimide film, was observed. This means that if the polyimide film was subject to annealing in a nitrogen atmosphere to thereby cause gas to discharge out of there, a film deposited on the polyimide film is not peeled off in later steps.

However, the first reference sample was accompanied with a problem that a dielectric constant of the polyimide film was increased. The polyimide film had a dielectric constant of 3.2 before annealing, but had an increased dielectric constant of 3.5 after annealing. The same result was obtained when the polyimide film was subject to annealing in an inert gas atmosphere such as an argon atmosphere or in a vacuum.

Contrary to the above-mentioned reference samples, a film deposited on the polyimide film was not peeled off in an annealing step, and a dielectric constant of the polyimide film was not increased in accordance with the eighth example. That is, the gas spectrum obtained by the temperature-up desorption process for the eighth example is the same as the gas spectrum illustrated in FIG. 12. A peak of the gas discharge at about 200 degrees centigrade was not observed.

In addition, a dielectric constant of the polyimide film was decreased to 3.0 after annealing from 3.2 before annealing. This result of reduction in a dielectric constant is quite desirable for a polyimide film to be used as an interlayer insulating film.

In the eighth example, as the upper film 104 illustrated in FIG. 1, a silicon dioxide film was deposited on the polyimide film. However, a material of which the upper film is composed and a method by which the upper film is made are not to be limited to those having been explained in the eighth example. For instance, the upper film may be formed as a silicon nitrogen film deposited by PCVD, a thin aluminum film deposited by sputtering, a thin copper film, a titanium film, a thin titanium nitride film, a tantalum film, a tantalum nitride film, a cobalt film, a tungsten film, a silicone film, a titanium silicide film, a tungsten silicide film, or a cobalt silicide film. The multi-layered wiring structure including one of the above-listed films deposited on the polyimide film provides the same advantages as those of the eighth example.

An interlayer insulating film may be made of other materials in place of polyimide. For instance, there may be selected fluorinated poly-arylethers originated from decafluorobiphenyl and phenylenediol, benzocyclobutene (BCB) made from 1,3-divinyl 1-1,1,3,3-tetramethyldisiloxane-bisbenzocyclobutene (DVS-bis BCB), perfluorocyclobutene (PFCB), or poly-tetrafluoroethylene (PTFE).

The above-mentioned eighth example is an embodiment in which an interlayer insulating film composed of polyimide is deposited on a first wiring layer, and a first insulating film composed of a material different from polyimide is deposited on the interlayer insulating film. It has been found out that the same advantages as those obtained by the eighth example can be obtained for a structure in which a second wiring layer is deposited on the first insulating film, a second interlayer insulating film composed of polyimide is deposited on the second wiring layer, and a second insulating film composed of a material different from polyimide is deposited on the second interlayer insulating film.

It would be obvious for those skilled in the art that a three or more-layered wiring structure obtained by repeating the steps of the eighth example could provide the same advantages.

It has been also found that defects such as poisoned via can be prevented in a structure in which an interlayer insulating film composed of polyimide is formed with via-holes, which are filled with plug electrodes to make electrical connection between upper and lower wiring layers.

In addition, in a structure where an interlayer insulating film composed of polyimide is formed with recesses, in which copper wirings are to be formed, a film deposited on the interlayer insulating film could be prevented from being peeled off by annealing the interlayer insulating film in advance, and then, forming the interlayer insulating film with recesses.

In the above-mentioned embodiments and examples, an interlayer insulating film is annealed at an atmospheric pressure in 100%-hydrogen atmosphere. However, it should be noted that atmosphere in which an interlayer insulating film is annealed is not to be limited to such 100%-hydrogen atmosphere.

For instance, an interlayer insulating film may be annealed at a reduced pressure in 100%-hydrogen atmosphere, in which case, a partial pressure of hydrogen may be equal to or greater than $1\times10^{-3}$ Torr. As an alternative, inert gas may be added to the atmosphere. The advantages obtained when an interlayer insulating film is annealed in hydrogen and inert gas atmosphere are the same as the advantages obtained when an interlayer insulating film is annealed in hydrogen atmosphere. What is important is that the annealing atmosphere has to have a partial pressure of hydrogen.

While the present invention has been described in connection with the preferred embodiments and examples, the present invention makes it possible to prevent a film deposited on an interlayer insulating film from being peeled off in subsequent steps by annealing the interlayer insulating film in a hydrogen atmosphere before depositing a film on the interlayer insulating film.

In addition, a dielectric constant of the interlayer insulating film may be decreased by annealing the film in a hydrogen atmosphere.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-95801 filed on Apr. 8, 1998 including specification, claims, drawings and summary is incorporated herein by reference in its entirety.

What is claimed is:

1. A method of fabricating a semiconductor device including an insulating film composed of carbon family material, said method comprising the steps of:
    (a) depositing an insulating film composed of carbon family material; and
    (b) annealing said insulating film in a hydrogen atmosphere at atmospheric pressure.

2. The method as set forth in claim 1, wherein said insulating film is deposited by any one of plasma-enhanced chemical vapor deposition, thermal chemical vapor deposition, and spin coating.

3. The method as set forth in claim 1, wherein said insulating film is composed of hydrogen-containing amorphous carbon.

4. The method as set forth in claim 3, further comprising the step of locally reducing a hydrogen concentration in the vicinity of interfaces between said hydrogen-containing insulating film and other films.

5. The method as set forth in claim 1, wherein said insulating film is composed of fluorine-containing amorphous carbon.

6. The method as set forth in claim 5, further comprising the step of locally reducing a fluorine concentration in the vicinity of interfaces between said fluorine-containing insulating film and other films.

7. The method as set forth in claim 1, wherein said insulating film is composed of poly-p-xylylene.

8. The method as set forth in claim 1, wherein said insulating film is composed of polyimide.

9. The method as set forth in claim 1, wherein said hydrogen atmosphere contains inert gas.

10. The method as set forth in claim 1, wherein said step (b) is carried out at a first temperature equal to or greater than a temperature at which said insulating film has been deposited.

11. The method as set forth in claim 10, wherein said first temperature is equal to or greater than 200 degrees centigrade, and equal to or lower than a second temperature at which said insulating film is decomposed.

12. The method as set forth in claim 10, wherein said first temperature is equal to or greater than 200 degrees centigrade, and equal to or lower than 450 degrees centigrade.

13. A method of fabricating a semiconductor device having a multi-layered structure and including an interlayer insulating film composed of carbon family material, said method comprising the steps of:

(a) depositing an insulating film on a lower wiring layer, said insulating film being composed of carbon family material;

(b) annealing said insulating film in a hydrogen atmosphere at atmospheric pressure; and (c) forming an upper wiring layer on said insulating film.

14. The method as set forth in claim 13, wherein said insulating film is deposited by any one of plasma-enhanced chemical vapor deposition, thermal chemical vapor deposition, and spin coating.

15. The method as set forth in claim 13, wherein said insulating film is composed of hydrogen-containing amorphous carbon.

16. The method as set forth in claim 15, further comprising the step of locally reducing a hydrogen concentration in the vicinity of interfaces between said hydrogen-containing insulating film and other films.

17. The method as set forth in claim 13, wherein said insulating film is composed of fluorine-containing amorphous carbon.

18. The method as set forth in claim 17, further comprising the step of locally reducing a fluorine concentration in the vicinity of interfaces between said fluorine-containing insulating film and other films.

19. The method as set forth in claim 13, wherein said insulating film is composed of poly-p-xylylene.

20. The method as set forth in claim 13, wherein said insulating film is composed of polyimide.

21. The method as set forth in claim 13, wherein said hydrogen atmosphere contains inert gas.

22. The method as set forth in claim 13, wherein said step (b) is carried out at a first temperature equal to or greater than a temperature at which said insulating film has been deposited.

23. The method as set forth in claim 22, wherein said first temperature is equal to or greater than 200 degrees centigrade, and equal to or lower than a second temperature at which said insulating film is decomposed.

24. The method as set forth in claim 22, wherein said first temperature is equal to or greater than 200 degrees centigrade, and equal to or lower than 450 degrees centigrade.

* * * * *